US 6,735,709 B1

(12) United States Patent
Lee et al.

(10) Patent No.: US 6,735,709 B1
(45) Date of Patent: May 11, 2004

(54) METHOD OF TIMING CALIBRATION USING SLOWER DATA RATE PATTERN

(75) Inventors: Terry R. Lee, Boise, ID (US); Kevin J. Ryan, Eagle, ID (US); Joseph M. Jeddeloh, Minneapolis, MN (US)

(73) Assignee: Micron Technology, Inc., Boise, ID (US)

( * ) Notice: Subject to any disclaimer, the term of this patent is extended or adjusted under 35 U.S.C. 154(b) by 485 days.

(21) Appl. No.: 09/708,440

(22) Filed: Nov. 9, 2000

(51) Int. Cl.[7] .............................. G06F 1/04; G06F 19/00
(52) U.S. Cl. .......................................... 713/401; 702/89
(58) Field of Search ................................. 713/400, 401, 713/500, 503; 702/85, 89

(56) References Cited

U.S. PATENT DOCUMENTS

| 5,841,580 | A | 11/1998 | Farmwald et al. |
| 5,917,760 | A | 6/1999 | Millar |
| 5,953,263 | A | 9/1999 | Farmwald et al. |
| 6,016,282 | A | 1/2000 | Keeth |
| 6,035,365 | A | 3/2000 | Farmwald et al. |
| 6,038,195 | A | 3/2000 | Farmwald et al. |
| 6,067,592 | A | 5/2000 | Farmwald et al. |
| 6,101,152 | A | 8/2000 | Farmwald et al. |
| 6,418,537 | B1 * | 7/2002 | Yang et al. .................. 713/400 |
| 6,434,081 | B1 * | 8/2002 | Johnson et al. ............. 365/233 |
| 6,606,041 | B1 * | 8/2003 | Johnson et al. ............. 341/120 |
| 6,622,103 | B1 * | 9/2003 | Miller ........................... 702/89 |

* cited by examiner

Primary Examiner—Thomas M. Heckler
(74) Attorney, Agent, or Firm—Dickstein Shapiro Morin & Oshinsky LLP

(57) ABSTRACT

An improved technique and associated apparatus for timing calibration of a logic device is provided. A calibration test pattern is transferred to a logic device first at a data rate slower than normal operating speed to ensure correct capture of the pattern at the device to be calibrated. Once the pattern is correctly captured and stored, the test pattern is transmitted to the logic device at the normal operating data rate to perform timing calibration. The improved technique and apparatus permits the use of any pattern of bits as a calibration test pattern, programmable by the user or using easily-interchangeable hardware.

186 Claims, 13 Drawing Sheets

METHOD OF TIMING CALIBRATION USING SLOWER DATA RATE PATTERN

FIELD OF THE INVENTION

The present invention relates to calibrating timing of command and data signals on data paths of logic devices, e.g. memory devices, and in particular to using a first data rate slower than the devices' normal operating rate to transfer a calibration bit pattern between logic devices during calibration.

BACKGROUND OF THE INVENTION

Memory devices are constantly evolving in the directions of faster speed and higher memory density. To this end, dynamic random access memory (DRAM) devices have evolved from simple DRAM devices to EDO to SDRAM to DDR SDRAM.

One characteristic of modern memory technology is that it may use both the positive- and negative-going edges of a clock cycle to READ and WRITE data to the memory cells and to receive command data from a memory controller. DDR SDRAM represents one example of a modern memory technology that utilizes both positive- and negative-going edges of a clock cycle.

Because of the required high speed operation of contemporary memory devices, system timing and output signal drive level calibration at start-up or reset is a very important aspect of the operation of such devices to compensate for wide variations in individual device parameters or within the system design itself.

One of the several calibration procedures which is performed in current memory devices is a timing synchronization of a clock signal with data provided on an incoming command/address path and on a data path DQ so that incoming data is correctly sampled and outgoing data is correctly timed. Currently, a memory controller achieves this timing calibration at system initialization (start-up or reset) by sending continuous transitions on the clock path and transmitting a 15 bit repeating pseudo random SYNC sequence "111101011001000" on the READ/WRITE data path DQ and the command/address path. The memory device determines an optimal internal delay for the clock path relative to arriving command/address and data signals to optimally sample the known bit pattern. This optimal delay is achieved by adjusting the timing of the received data bits to achieve a desired bit alignment relative to the clock. This is accomplished by adjusting a relative timing of clock and data signals, for example setting delay values in the clock or data signal paths, until the received data is properly sampled by the clock and recognized internally. Once synchronization has been achieved, that is, the proper timing on the receiving data or clock paths have been set, the memory controller stops sending the SYNC pattern and the memory device, after all calibrations are completed, can be used for normal memory READ and WRITE access.

To perform the above-described calibration operations, each memory device in a current memory system typically contains means for generating the calibration bit pattern internally, independent of the memory controller. During calibration, the data incoming on a data path under calibration is compared to the internally-generated calibration pattern at each memory device. Internal generation of the calibration bit pattern requires that each memory device contain the additional circuitry needed for pattern generation. For example, each memory device may include the four-bit shift register circuit illustrated in FIG. 6. Because of circuit die size constraints, it would be preferable to simplify the circuitry by avoiding the requirement of generating the calibration bit pattern at every memory device.

While the timing calibration described above, which is conducted at start-up and reset, has been found to perform adequately in most circumstances, there is a problem in that as the data rate of memory devices is increased, the timing margin for data capture is decreased. The timing margin for data capture is the amount of time that valid data is available on the bus or at a device for use during system operations after practical system effects are introduced. For example, for a data transfer rate of 1 GHz ($1\times10^9$ Hz), the maximum possible data valid time is only 1 ns ($1\times10_{-9}$ seconds). When practical system effects are introduced, such as accounting for device setup and hold, the timing margin for data capture is even less, for example, a timing margin of less than 100 ps ($100\times10^{-12}$ seconds) is typical.

This timing margin can be increased by precisely calibrating and aligning the received data with the data capture clock. Improved calibration techniques can reduce the total data arrival time uncertainty that must be accounted for from a theoretical maximum to the actual timing uncertainty observed at the device under actual operating conditions. This reduction in uncertainty results in a corresponding decrease in the timing budget allocated to uncertainty and thus an increase in the timing margin for data capture.

One area in which calibration and alignment with the data capture clock may be improved is in the bit composition of the calibration test pattern. Current systems customarily use a single calibration bit pattern for all calibration operations. Because the same calibration bit pattern may be used for multiple circuit configurations, the bit pattern is designed to test a variety of circuit conditions, although the exact conditions to be encountered are largely unknown at the time of circuit design. The bit pattern may be selected to test a variety of circuit characteristics that affect timing, including static layout length differences, input path delay differences, intersymbol interference, and simultaneously switching outputs.

Moreover, the calibration bit pattern currently in use, for example the 15-bit pseudo random pattern, may not perform optimally for modern high performance memory systems. Because current memory devices capture incoming data on both positive and negative going transitions of the clock signal, even when timing calibration is achieved it may not be clear if alignment was achieved on a positive going or negative going clock edge. That is, the 15-bit synchronization pattern lacks any timing signature. If, for example, synchronization was achieved on the negative going edge of a clock signal when the circuitry is designed on the assumption that synchronization is achieved on a positive going edge, when data is later sampled during memory access the data sampling may be off by one bit. Thus, calibration may be achieved in the wrong phase of the clock signal, leading to incorrect sampling of the data during memory access operations, or requiring additional complicated circuitry to ensure that incoming data is synchronized to the proper phase of the clock.

Therefore, there is a need and desire for an improved calibration technique implementable in logic using simplified circuitry that is capable of compensating for a variety of circuit characteristics that may affect timing.

SUMMARY OF THE INVENTION

An improved technique and associated apparatus for timing calibration of a logic device, e.g. a memory device, is provided. A calibration bit pattern is transferred to a logic device first at a data rate slower than normal operating speed to ensure correct capture of the bit pattern at the device to be calibrated. Once the pattern is correctly captured and stored, a calibration signal containing the calibration bit s pattern is transmitted to the logic device at the normal operating data rate and timing calibration at the logic device can occur.

The improved technique and apparatus permits the use of any pattern of bits as a calibration test pattern, programmable by the user or using easily-interchangeable hardware. The test bit pattern can thus be adapted to provide a better stimulus for characterizing the timing performance of a particular system or the expected data patterns that the data paths are expected to encounter.

Because the logic for generating the calibration test pattern is no longer required to be included in each system device (i.e., each logic device no longer requires a shift register for generating a local pseudo-random pattern), the invention simplifies the logic and thus reduces die size overhead for many logic devices. The resulting die size savings desirably reduces the cost and complexity of system devices.

BRIEF DESCRIPTION OF THE DRAWINGS

The above and other advantages and features of the invention will be more clearly understood from the following detailed description of the invention which is provided in connection with the accompanying drawings in which.

DETAILED DESCRIPTION OF THE PREFERRED EMBODIMENTS

The invention will now be described with respect to the aspect of the invention wherein any pattern of bits may be used as a calibration pattern. In the following, a novel method and associated apparatus is described for transmitting and receiving a calibration bit pattern at a rate slower than a normal operating rate of a receiving logic circuit to ensure correct capture of the calibration bit pattern. However, other methods of ensuring the correct transmission and capture of a calibration pattern at a logic device in a digital circuit are possible, and the invention is not to be limited to any particular method of transmission or capture of digital bits.

Figure 9B:
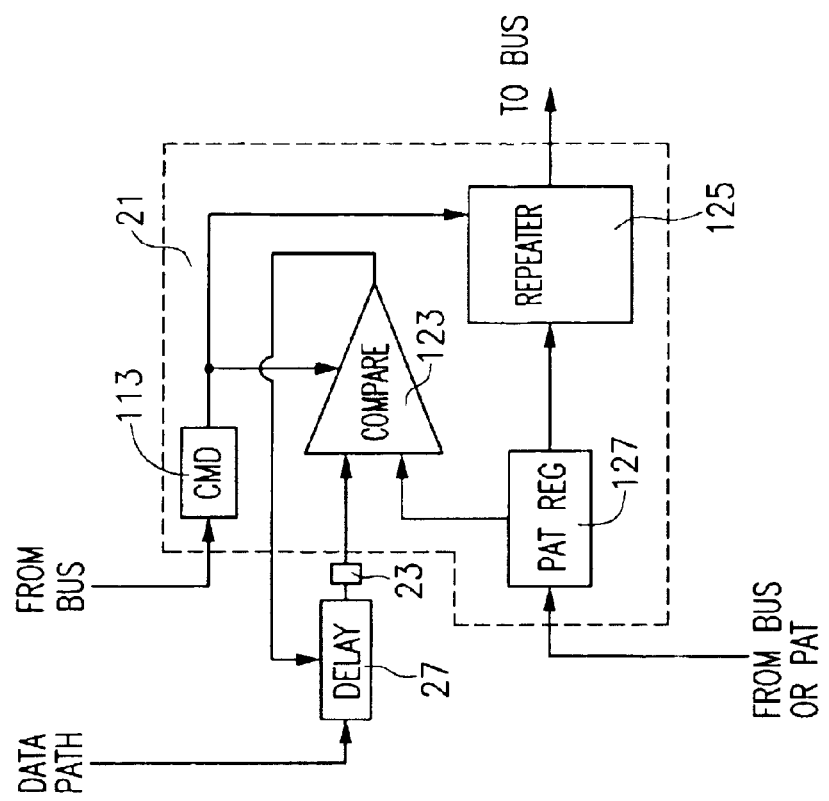
FIG. 9(B) illustrates a portion of the digital circuit shown in FIG. 9(A)
Figure 9A:
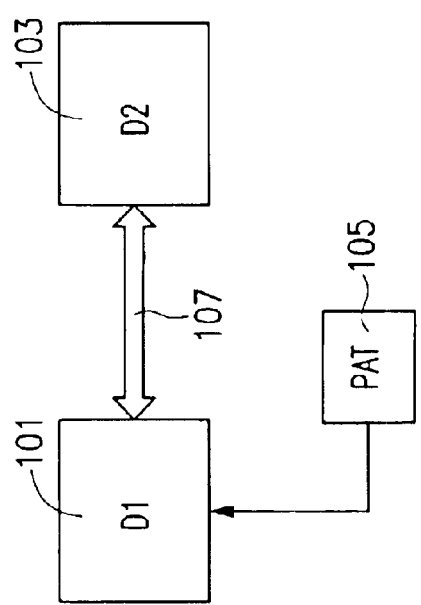
FIG. 9(A) illustrates a digital circuit including two logic devices employing calibration structures and process methodologies in accordance with an embodiment of the invention.

FIGS. 9(A) and 9(B) show an embodiment of the invention used in an exemplary digital circuit, such as a memory circuit. Referring to FIG. 9(A), a digital circuit topology is shown including two logic devices 101, 103 connected by a bus 107. Each of the logic devices 101, 103 includes a control logic circuit 21, such as that illustrated in FIG. 9(B). Each control logic circuit 21 includes a compare circuit 123, a pattern register 127 for storing a calibration bit pattern, a repeater circuit 125, and a command recognition circuit 113. The output of the compare circuit 123 is used to control a variable delay circuit 27 in the data path of the signal under calibration. At least one of the logic devices 101, 103 is connected to receive the calibration bit pattern from an external calibration pattern storage device 105, shown in FIG. 9(A).

The logic devices 101, 103 may be, for example, a memory controller and a memory device, but this is not required. Other examples of logic devices 101, 103 that may utilize the invention include, respectively, a bus master and bus slave, a DRAM controller and a DRAM memory device, a microprocessor and a control logic chip, and a network hub and/or switch and an adapter card.

The external calibration pattern storage device 105 may be a circuit or a combination of circuits capable of storing and/or transmitting a pattern of digital bits, including a shift register or other pattern generation circuit, static pins or other hardwired circuit for storing a pattern, a cache memory, a network connection to an external bit pattern source, a read only memory (ROM) or a basic input/output system (BIOS).

Figure 6:
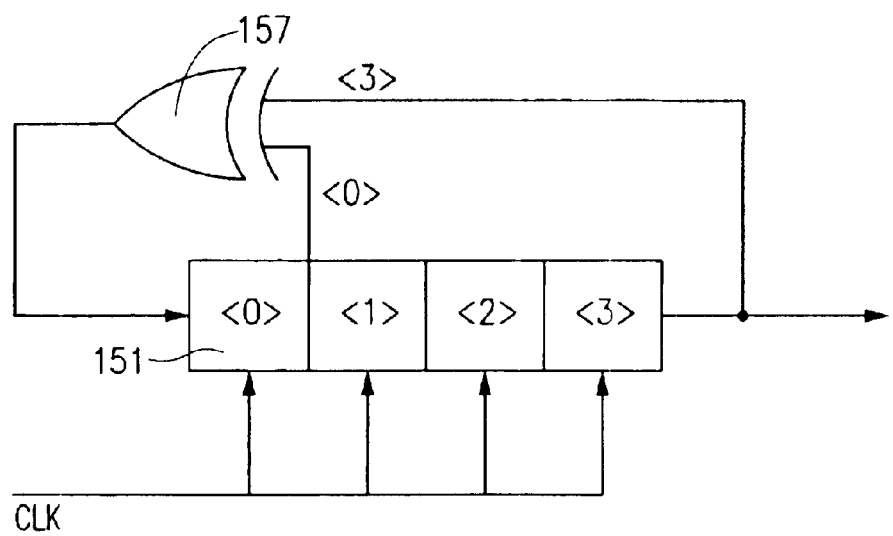
FIG. 6 is a representative circuit for generating a calibration pattern used in one embodiment of the invention.

For example, FIG. 6 illustrates an exemplary circuit which may be used as a calibration pattern storage device 105. The exemplary circuit of FIG. 6 generates the calibration pattern, such as a $2^N-1$ bit pattern, where N=4, to produce a repeating 15 bit pattern. It includes a four stage shift register 151 having bit positions <0><1><2><3> and an exclusive OR gate 157 having a pair of inputs respectively connected to the output of the first stage output <0> and the last stage output <3> of shift register 151. The output of exclusive OR gate 157 is applied as an input to stage <0> of shift register 151. The clock signal CLK is applied to shift register 151. The shift register 151 can initially be seeded with all ones "1" at stages <0><1><2><3> and it will generate the repeating 15 bit pattern "111101011001000."

In conventional memory systems, the circuit shown in FIG. 6 was formerly included at each memory device as well as at the memory controller. In the present invention, only one such circuit may be required to generate the calibration pattern which is transmitted and stored at each memory device. Thus, the present invention conserves resources at each device by eliminating the need to have the four-bit shift register circuit of FIG. 6. Instead, only a minimal storage capability (pattern register 127) and a repeater circuit 125 may be used.

Alternatively, instead of generating the repeating bit pattern with a shift register circuit as shown in FIG. 6, the calibration pattern storage device 105 may be a ROM, BIOS or other hardwired circuitry from which the calibration pattern is repeatedly read out during calibration.

During preparation for timing calibration of the data paths of the logic devices 101, 103, the calibration pattern, originally generated at and/or stored at the pattern storage device 105, is received at each logic device 101, 103 shown in FIG. 9(A). For example, a first logic device 101 receives the calibration pattern from the pattern storage device 105 and transmits the calibration pattern to a second logic device 103. When the calibration pattern is received at the second logic device 103, it is stored in the pattern register 127 at the second logic device. As noted, transmission of the calibration pattern from a single pattern storage device 105 to each of the logic devices 101, 103 permits one pattern generation circuit to serve the pattern-generation needs of an entire system. For example, only one pattern generation circuit may be needed for a memory system containing a memory controller and a plurality of memory devices. After logic devices 101, 103 have received the calibration pattern, preparation is complete and calibration of signals paths of each logic device 101, 103 may begin.

In order to ensure correct transmission and capture of the calibration pattern at each logic device 101, 103, the calibration pattern is transmitted to and between the logic devices 101, 103 at a first data rate slower than a normal operating rate of the logic devices. For example, the calibration pattern may be transmitted to the first logic device 101 and between the first logic device 101 and the second logic device 103 at a rate which is 25% of the rate at which the logic devices 101, 103 normally transmit and receive data (i.e. the normal rate is four times as fast as the pattern transmission rate). The slow rate ensures that each bit of the calibration pattern is correctly received at the logic device 101, 103.

Before slow transfer of the calibration bit pattern may take place, the system may be commanded to slow the rate of data transfer during transmission of the pattern. Because no previous timing calibration may have occurred prior to transmission of the calibration pattern, the target logic device 103, 101 may not be able to properly recognize commands transmitted at normal operating speed on a high speed bus. Therefore the target logic device 103, 101 should be commanded into the slow pattern mode via a low speed bus or via a lower effective data rate code on a higher speed bus. This will ensure that the command for entering the slow pattern input mode will be recognized.

Referring to FIG. 9(B), a pattern input mode command from an external source (i.e., from a memory controller) may be received at the command detector 113 in the control logic circuit 21 of a logic device 101, 103. A combination of slow speed signal paths or an unusual state not used in normal operating modes may be used to recognize the pattern input mode command at the command detector 113, as is well known in the art. For example, a slower speed pin, such as a CKE pin in an SDRAM, may be toggled a number of times to signal the slow pattern input mode. Another example is a combination of four consecutive burst terminate commands in a DDR SDRAM. Since each burst terminate command is identical, the command pins would not transition for at least four clock cycles, and thus the command input is easily captured. To be reliable, the transmitting device may send more than the minimum number of repeated commands, for example six repeated commands. Alternately, a separate pattern input mode pin could be provided, but would require an additional signal path.

Upon recognizing the pattern input mode command, the command detector 113 transmits a signal to both the compare circuit 123 and the repeater circuit 125 to signal them of the slow pattern input mode operation (e.g., both circuits are shut off during transmission and storage of the calibration bit pattern). After the calibration bit pattern is received and stored in the pattern register 127 of the control circuit 21 of a logic device 101, the command detector 113 activates the repeater circuit 125 for transmission of the calibration bit pattern at the normal operating rate for calibration of another logic device 103. The repeater circuit may allow the stored pattern to be driven back out onto the external signal path or bus. Subsequently, or at the same time, the command detector 113 may activate the compare circuit 123 for calibration of the logic device 101. The command detector 113 also may subsequently receive commands terminating calibration operations and may transmit appropriate shutdown signals to the compare circuit 123 and the repeater circuit 125.

For example, after logic device 101 receives the calibration bit pattern from pattern storage device 105 (see FIG. 9(A)) and stores it in the pattern register 127 of its control circuit 21 (see FIG. 9(B)), the command detector 113 activates its repeater circuit 125 for transmission of the calibration bit pattern to logic device 103. Although shown in FIG. 9(A) as supplying the calibration bit pattern to logic device 101, it is apparent that the pattern storage device 105 may instead first supply the pattern to another logic device in the system, such as logic device 103, that may subsequently transmit the calibration bit pattern to the logic device 101.

Figure 7:
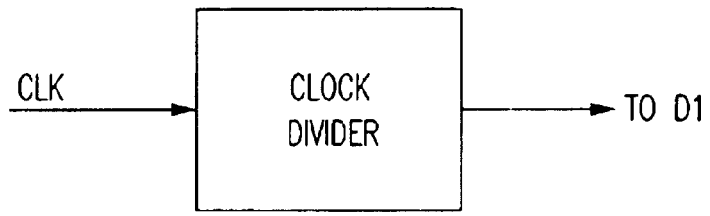
FIG. 7 illustrates exemplary clock divider circuitry in accordance with an embodiment of the invention.

After the system is commanded to enter the pattern input mode, transfer of the calibration bit pattern at the slow rate may commence. In one embodiment of the invention, the slower transfer rate may be accomplished by reducing the frequency of the clock signal with which the calibration pattern is synchronized. This embodiment may require an additional clock signal path and/or clock divider circuitry. FIG. 7 shows an example of a clock divider circuit interposed in the clock signal path prior to its use in FIG. 2. The clock divider circuit would cause the clock signal to transition fewer times per unit time and hence slow operation of the logic devices 101, 103 during transmission of the calibration bit pattern to the logic devices 101, 103.

In devices that use a delay locked loop (DLL) 41 (see FIG. 2) or a phase locked loop (PLL), it may be necessary to turn the DLL/PLL off, since the slower clock rate may be too low for the DLL/PLL to operate correctly. For example, when the control logic circuit 21 receives a command indicating the bit pattern is to be transmitted at the slower rate, it may command the DLL 41 to shut down.

Figure 12:
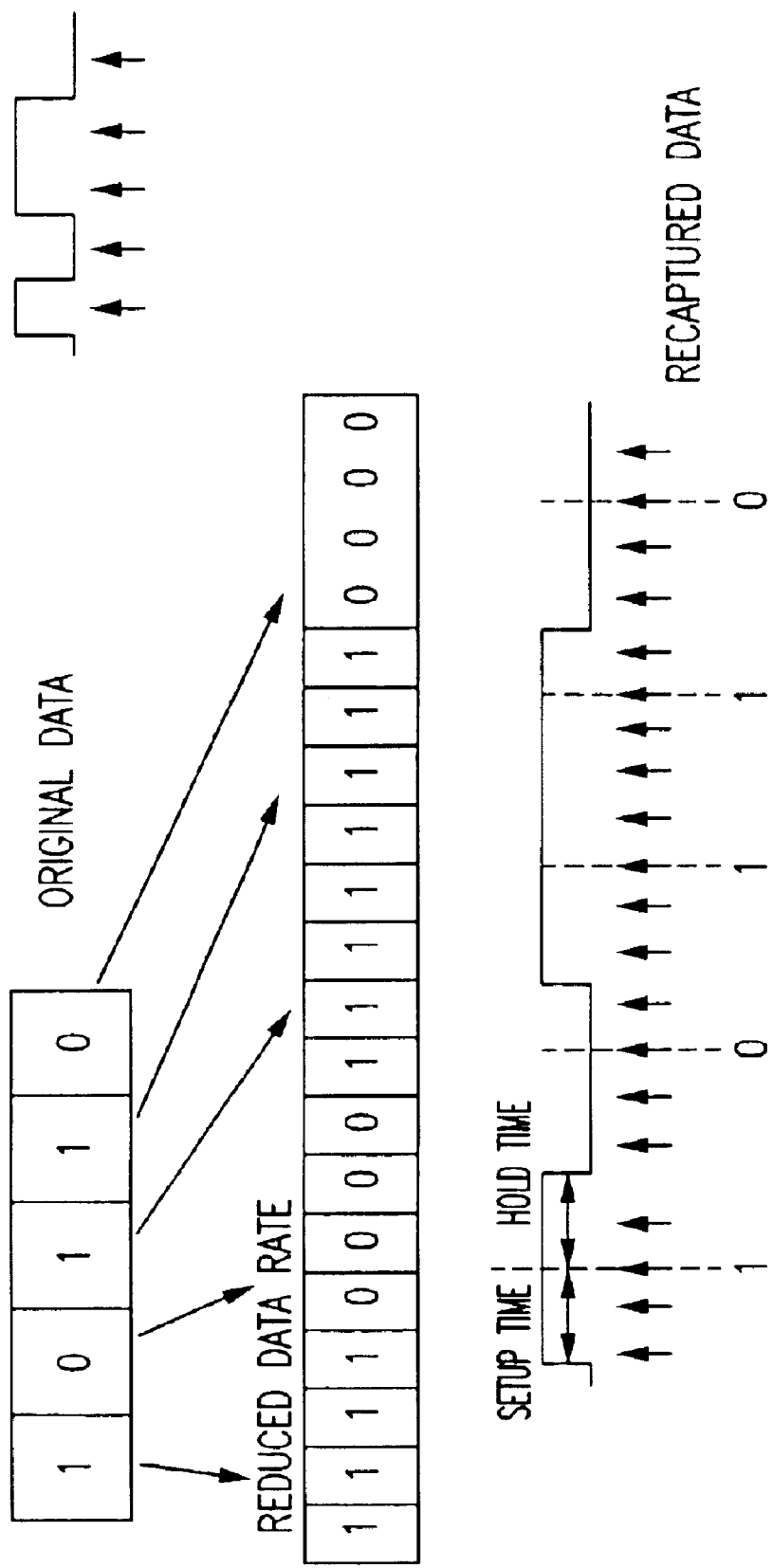
FIG. 12 illustrates a graphic example of data rate expansion in accordance with an embodiment of the invention.

In other embodiments of the invention, alternate methods may be used to slow the data rate of transmission of the calibration pattern. One method is illustrated in FIG. 12 and includes repeating each bit to be transmitted N times before transmitting the next bit in the calibration pattern. For example, FIG. 12 illustrates repeating each bit four consecutive times before starting the next bit. This method effectively slows the rate of transmission of the calibration pattern to one-fourth of the normal transmission rate. When the calibration pattern is received by the logic device 101, 103, only one bit in N (e.g., four) may be captured and still correctly capture the calibration pattern. To avoid timing problems resulting in capture errors, a bit in the middle of each repeated sequence may be chosen to be captured. By avoiding the data bits at the beginning or the end of the 4 bit consecutive pattern, adequate timing margin is assured, since there is substantial setup and hold time of the data bit to the capture clock (over one bit time). The remaining three bits in the four bit consecutive pattern may be ignored.

Figure 15:
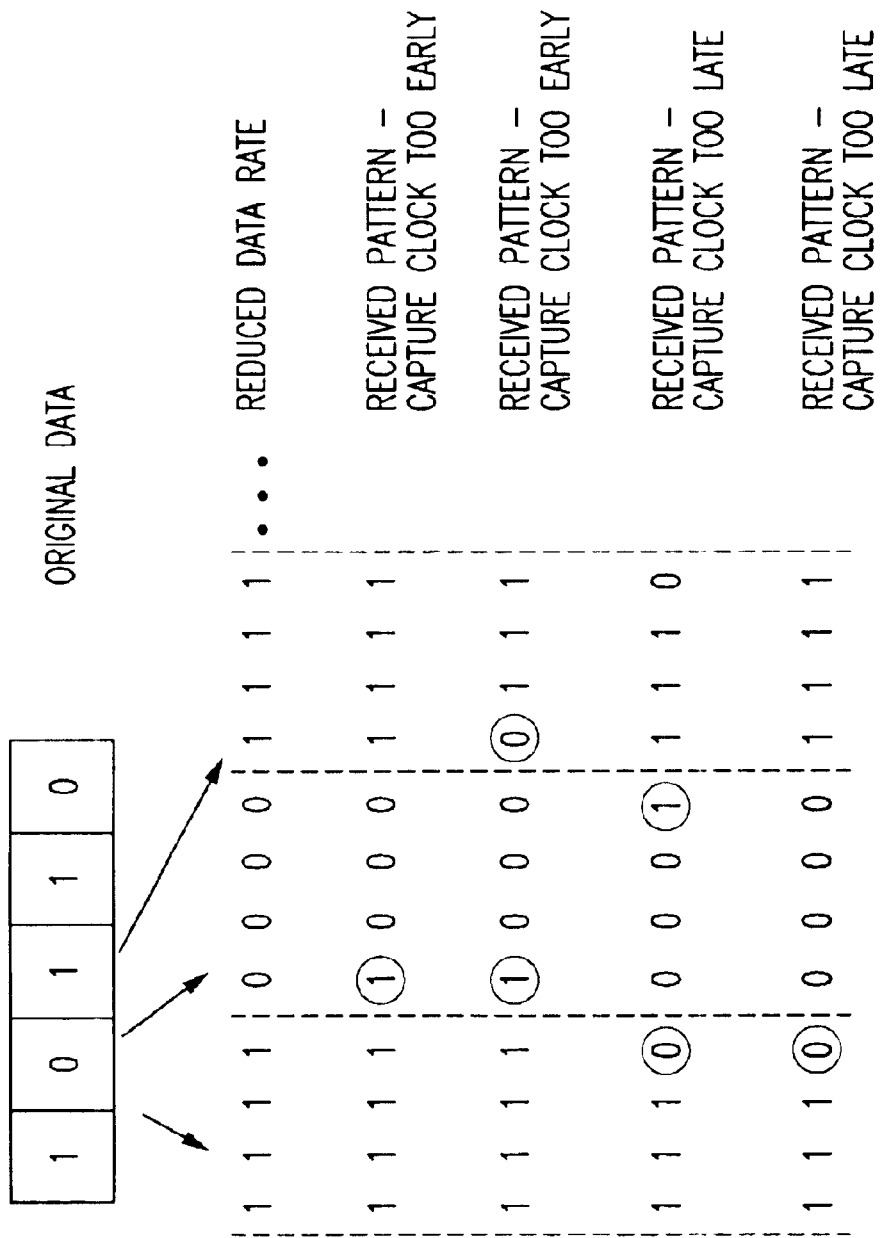
FIG. 15 illustrates exemplary patterns detected during timing calibration of a circuit in accordance with an embodiment of the invention.

For example, even if the data eye is misaligned such that capture of a given bit at high speed may not be possible, capture of the same bit repeated four consecutive times is likely, if a middle bit is attempted to be captured, because the correct bit is captured whether the capture is early or late. FIG. 15 shows several exemplary received data patterns for the cases of early and late clocking of the capture of data on an incoming signal path.

Such a procedure of repeating each bit of the calibration pattern N consecutive times may be desired in order to avoid any timing errors of the system prior to calibration. Because the calibration pattern may be transmitted on a signal path of a logic device 101, 103 that has not yet been calibrated, repetition of the bits, combined with capture of bits in the middle of the received sequence, may advantageously avoid errors and ensure correct capture of the calibration pattern. The logic devices 101, 103 may then proceed with calibration operations at the normal operating speed.

Figure 13:
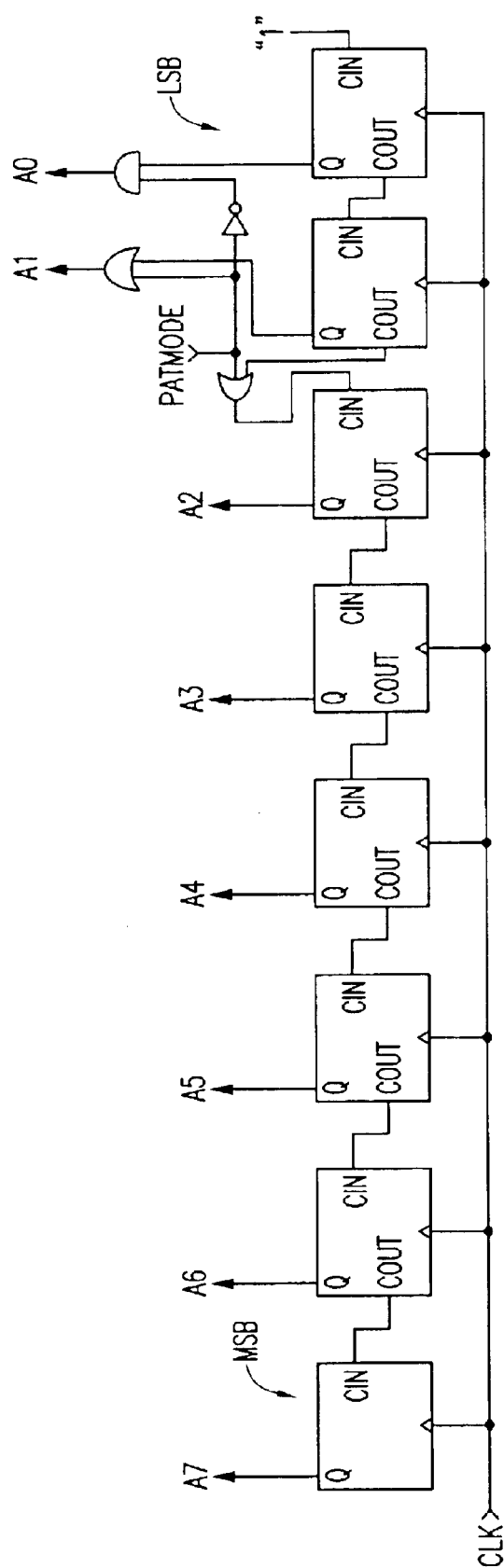
FIG. 13 illustrates a modified linear address counter used in an embodiment of the invention.
Figure 14A:
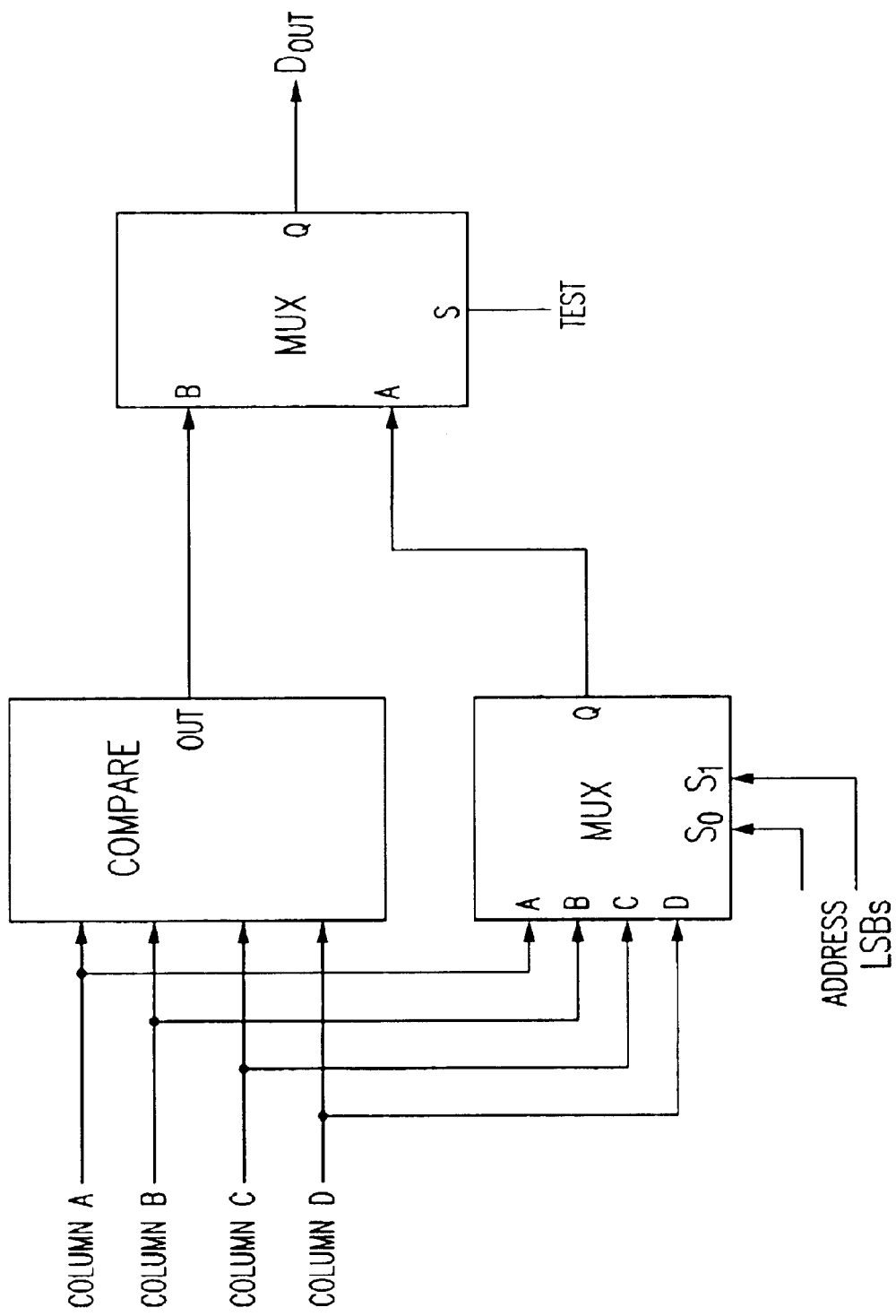
FIG. 14(A) illustrates a JEDEC test mode circuit that may be used in conjunction with an embodiment of the invention.
Figure 14B:
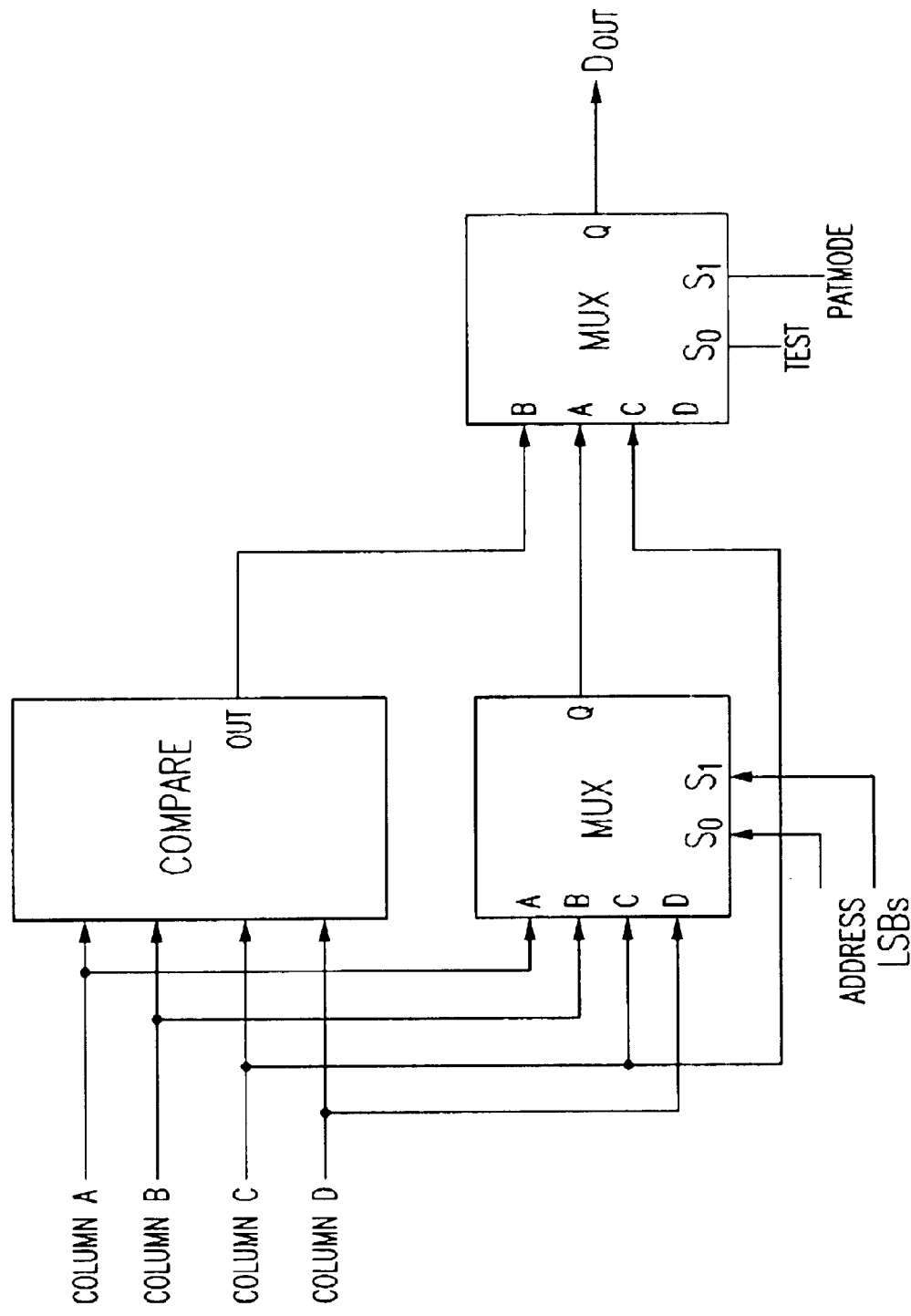
FIG. 14(B) illustrates a modified JEDEC test mode circuit which may be used in an embodiment of the invention.

Storage of the calibration pattern in the pattern register 127 once it is captured may be carried out in different ways. Where each bit of the calibration pattern is repeated N consecutive times, one embodiment stores each and every bit transmitted in the pattern register 127. However, when the calibration pattern is retrieved from the pattern register 127 for production of the calibration signal consisting of the repeated calibration pattern, only every Nth bit is retrieved (i.e. a middle bit, such as the third bit, is retrieved, for N=4). This embodiment may be implemented using the modified linear address counter shown in FIG. 13 or using the modified JEDEC test mode circuit shown in FIG. 14(b). Referring to FIG. 13, an 8-bit linear address counter is shown with A7 as the most significant bit (MSB) and A0 as the least significant bit (LSB). The carry bit (CIN) is always set to logic one "1" for the LSB. When the calibration pattern is retrieved from the pattern register 127, the PAT-MODE signal is set to a logic one "1", which forces A0 to a logic zero "0" and A1 to a logic one "1". This also forces the CIN of A2 to a logic one "1", so that A2 toggles on every clock cycle, as A0 would toggle in the unmodified linear address counter. If A2–A7 are all logic zero "0", the first state has A0 =logic zero "0" and A1 =logic "1" (i.e., the binary number equivalent of address location 3). At the next clock cycle, A2 transitions to logic one "1", and all other bits remain the same (i.e., the binary number equivalent of address location 7). Thus, every Nth address is counted where N=4. Referring to FIGS. 14(a) and 14(b), a conventional JEDEC test mode circuit (FIG. 14(a)) is modified (FIG. 14(b)) so that the output data (DOUT) is always the contents of the Nth address read out of memory, where N=4.

In another embodiment the pattern register 127 stores only every Nth bit transmitted to the logic device 101, 103. This embodiment may also use the modified linear address counter shown in FIG. 13 or the modified JEDEC test mode circuit shown in FIG. 14(b), connected to a read-in buffer of the incoming data path. For example, for a burst mode device which reads four bits at time, the pattern register may store only every fourth bit. Then the calibration pattern can be read out of the pattern register 127 like any other data.

In yet another embodiment, a prefetch scheme memory architecture may be used. The prefetch architecture is often used when the data rate of the information entering or leaving a memory device is faster than the cycle times of a memory array of the memory device. Referring to FIG. 10(B), data entering a memory device (e.g., incoming WRITE data) is first demultiplexed in a demultiplexer 201 to a slower rate, then written to the memory array multiple bits at a time (with a wider data path) after a minimum amount of data has been received. When the same data is read out of the memory array (e.g., for a READ operation), the same minimum amount of data is read simultaneously from the memory array and multiplexed to the higher data rate (e.g., the normal operating rate) at the output. The prefetch memory technique can be used with a slow data pattern calibration scheme in which each bit of the calibration pattern is repeated M times, for example four times, by writing the incoming data to the memory array in multiple array access times, so that the bits of the calibration pattern are not all written simultaneously. This may require the use of memory data write masking modes. For example, for a 16-bit calibration pattern, each bit of the calibration pattern incoming to the prefetch circuitry shown in FIG. 10(B) may be repeated 4 times and thus 64 bits may be received before the 16 bits of the calibration pattern may be written to the memory array. To write the correct 16 bits to the array, a write masking mode may be used to select only every third bit received to be written to the array.

The prefetch memory architecture may also be implemented to write only every Nth bit to the memory and read out the calibration pattern at the normal higher speed data rate. The received data may be demultiplexed as required to meet the memory prefetch width. Instead of shifting every received data bit in the demultiplexer 201, only every Nth bit is shifted in. The shifted bit is chosen so it is not near a signal transition. X shifts occur before the contents of the demultiplexer 201 are parallel transferred into the memory array, X bits wide, which corresponds to an X bit prefetch. An example of this technique is illustrated in FIG. 10(A).

Figure 10A:
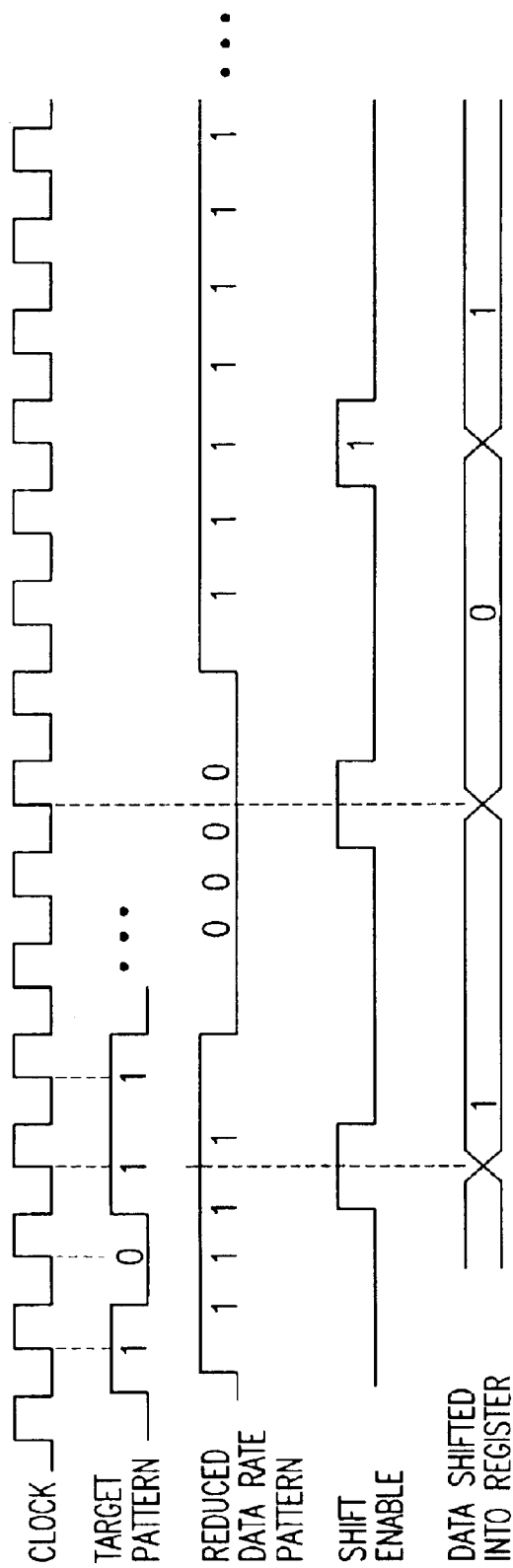
FIG. 10(A) illustrates a graphic example of using a prefetch memory scheme with an embodiment of the invention.
Figure 10B:
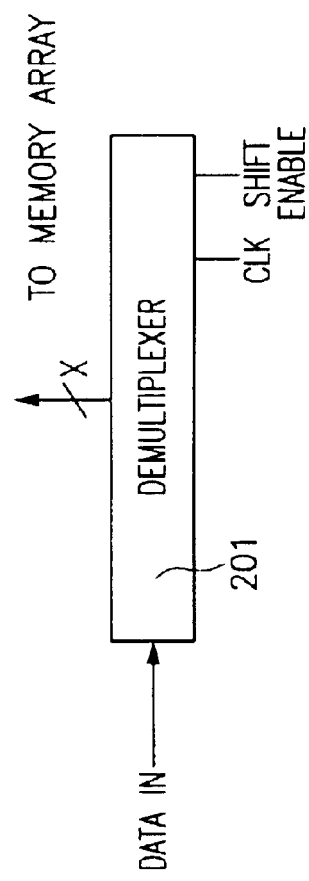
FIG. 10(B),illustrates a portion of a memory circuit using the prefetch memory scheme illustrated in FIG. 10(A)

FIG. 10(A) shows data being received on both rising and falling edges of the clock, but at the reduced data rate. In the example shown in FIG. 10(A), the third bit is shifted in, then the seventh bit, etc. Once the shift register is full with X bits, the entire contents are transferred to memory as in normal prefetch operations. Note that the cycle time is reduced to the memory by a factor of N×X, as opposed to a factor of X with a normal data rate prefetch scheme. Upon read out, X bits are fetched from the memory array, and when they are multiplexed out of memory, the original target calibration pattern is restored at the normal operating data rate.

After transmission and storage of the calibration pattern in the pattern register 127 of each logic device 101, 103, calibration proceeds in a sequential manner. Referring to FIG. 9(A), a first logic device 101 is calibrated using a first calibration signal transmitted from the second logic device 103. Once the first logic device 101 is correctly calibrated, the second logic device 103 is calibrated using a second calibration signal transmitted from the first logic device 101. Referring to FIG. 9(B), the first and second calibration signals are produced using a repeater circuit 125 that repeats the bits comprising the calibration bit pattern stored in the pattern register 127. Thereafter those repeated bits are transmitted and applied to a signal path of the first and second logic devices 101, 103, respectively. The calibration signal may be applied to a signal path of a logic device 101, 103 by transmitting the calibration signal over the bus 107.

During calibration of each logic device 101, 103, the timing of the signal path on which the calibration signal is transmitted is synchronized with a clock signal. In order to properly synchronize the signal path under calibration with the clock signal, the control logic circuit 21 compares the pattern of bits received on the signal path under calibration with the stored calibration bit pattern using the compare circuit 123 (see FIG. 9(B)). If a match is reliably achieved, then the signal path is correctly calibrated. If not, the timing of one of the data or clock signal paths is adjusted, for example a delay value of the variable delay circuit 27 is adjusted. This process is repeated until a match is reliably achieved.

Figure 11:
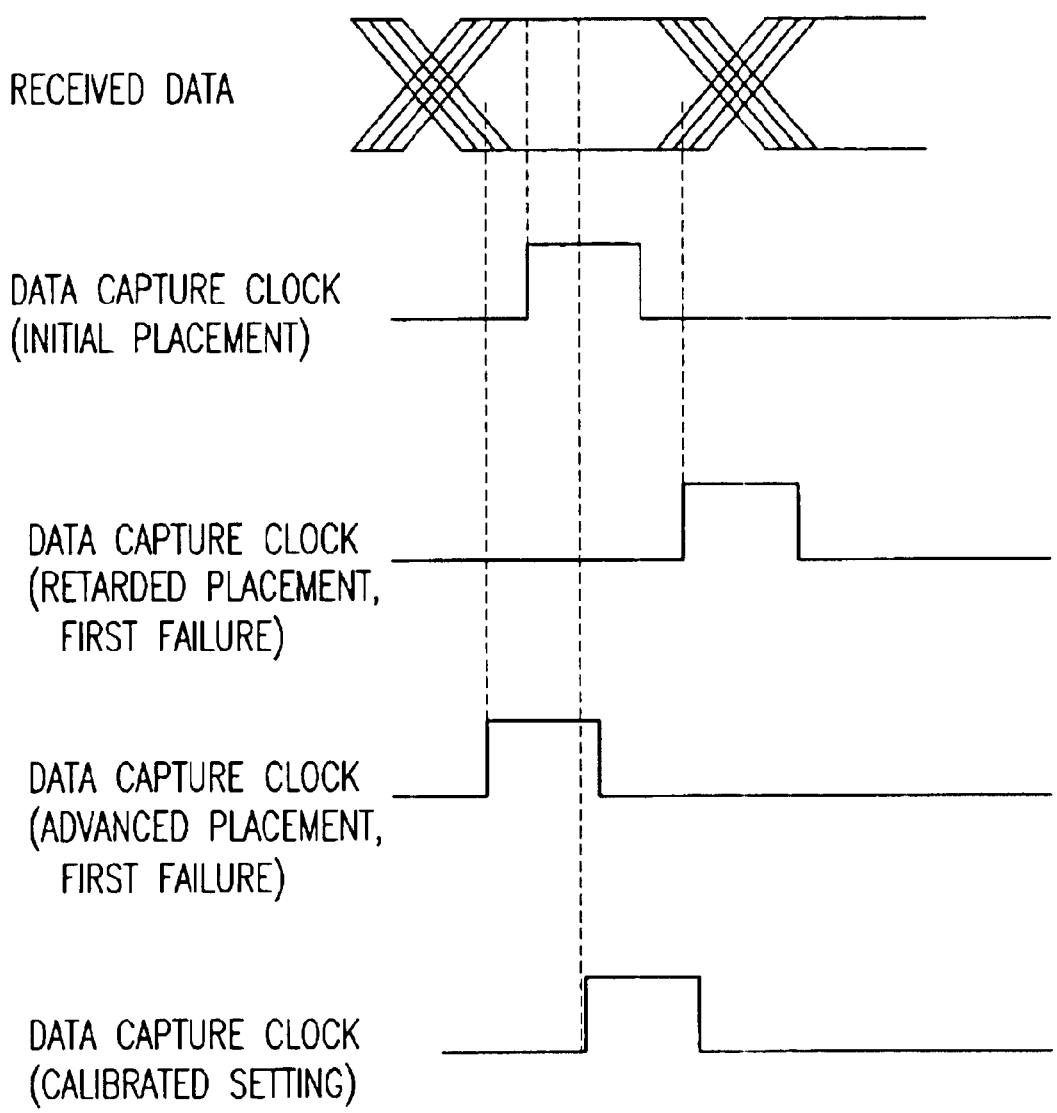
FIG. 11 illustrates a series of simplified timing diagrams showing exemplary timing settings for data capture timing calibration in accordance with an embodiment of the invention.

Several timing possibilities are illustrated in FIG. 11. Correct capture of data on the signal path under calibration may be achieved when a rising edge of the clock signal, such as the data capture clock signal DCLK, is aligned with the center of the "data eye" of the data received on the signal path. FIG. 11 shows the data eye of the received data on the signal path under calibration as it compares to several different timing possibilities of the clock signal which may be explored by varying the timing, for example varying the delay value of the variable delay circuit 27. These different timing possibilities include arbitrary initial placement of the rising edge of the clock signal, a retarded placement where the delay value is too high, an advanced placement where the delay value is too low, and a calibrated setting where the rising edge of the clock signal is in the center of the data eye.

Figure 1:
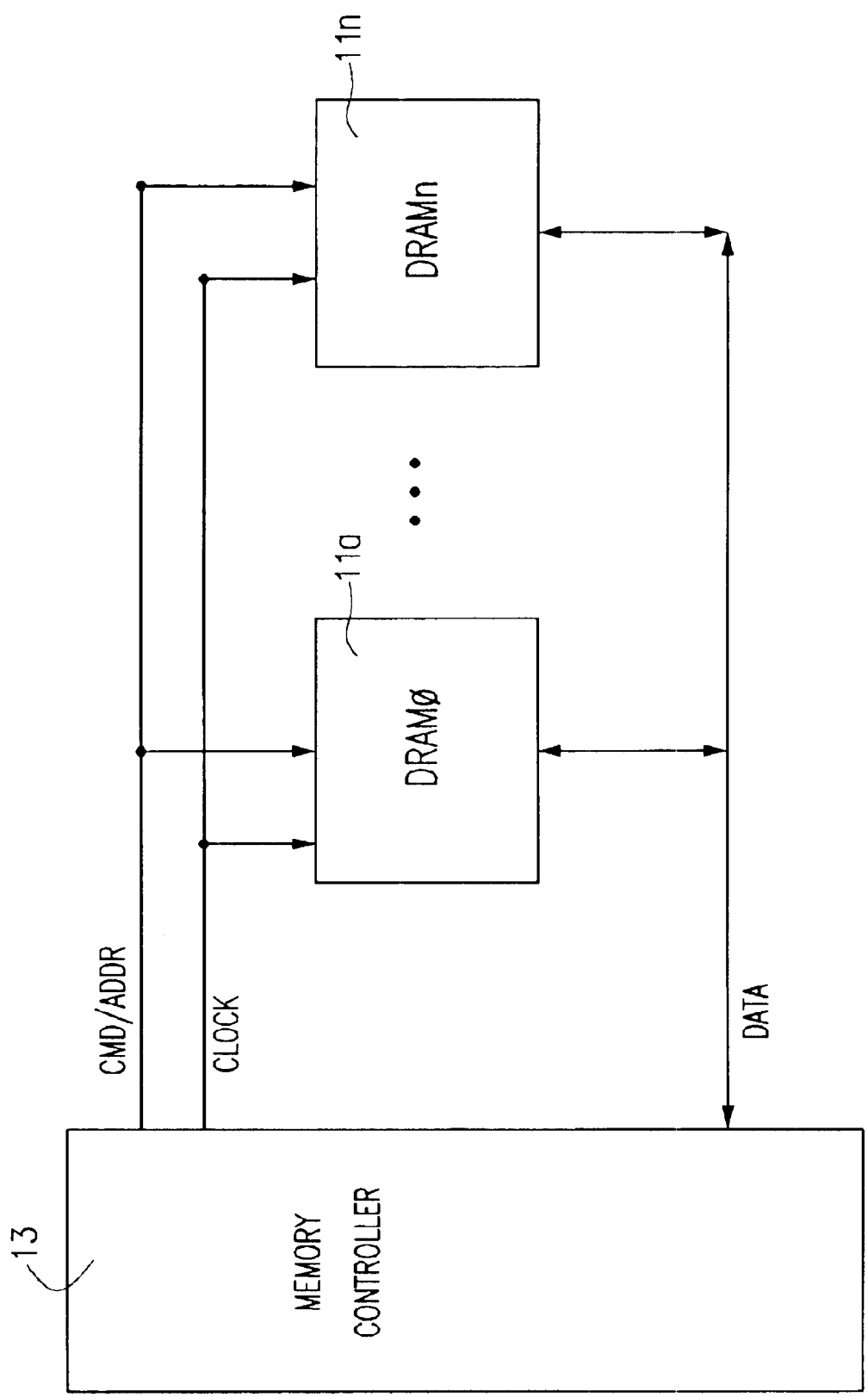
FIG. 1 illustrates a memory circuit topology with which the invention is used.

A semiconductor memory system which may employ the invention is illustrated in FIG. 1. It includes a plurality of DRAM modules 11a . . . 11n which are accessed and controlled by a memory controller 13. Memory controller 13 provides a command link to each of the DRAM modules 11a . . . 11n which includes a clock signal path and a command/address path. In addition, a bidirectional data bus is provided between memory controller 13 and each of the DRAM modules 11a . . . 11n. The clock is used to strobe input/output data into and out of the DRAM modules. The memory controller 13 may contain a logic device 101 of FIG. 9(A) while each of the DRAM memory modules may contain a logic device 103.

Figure 2:
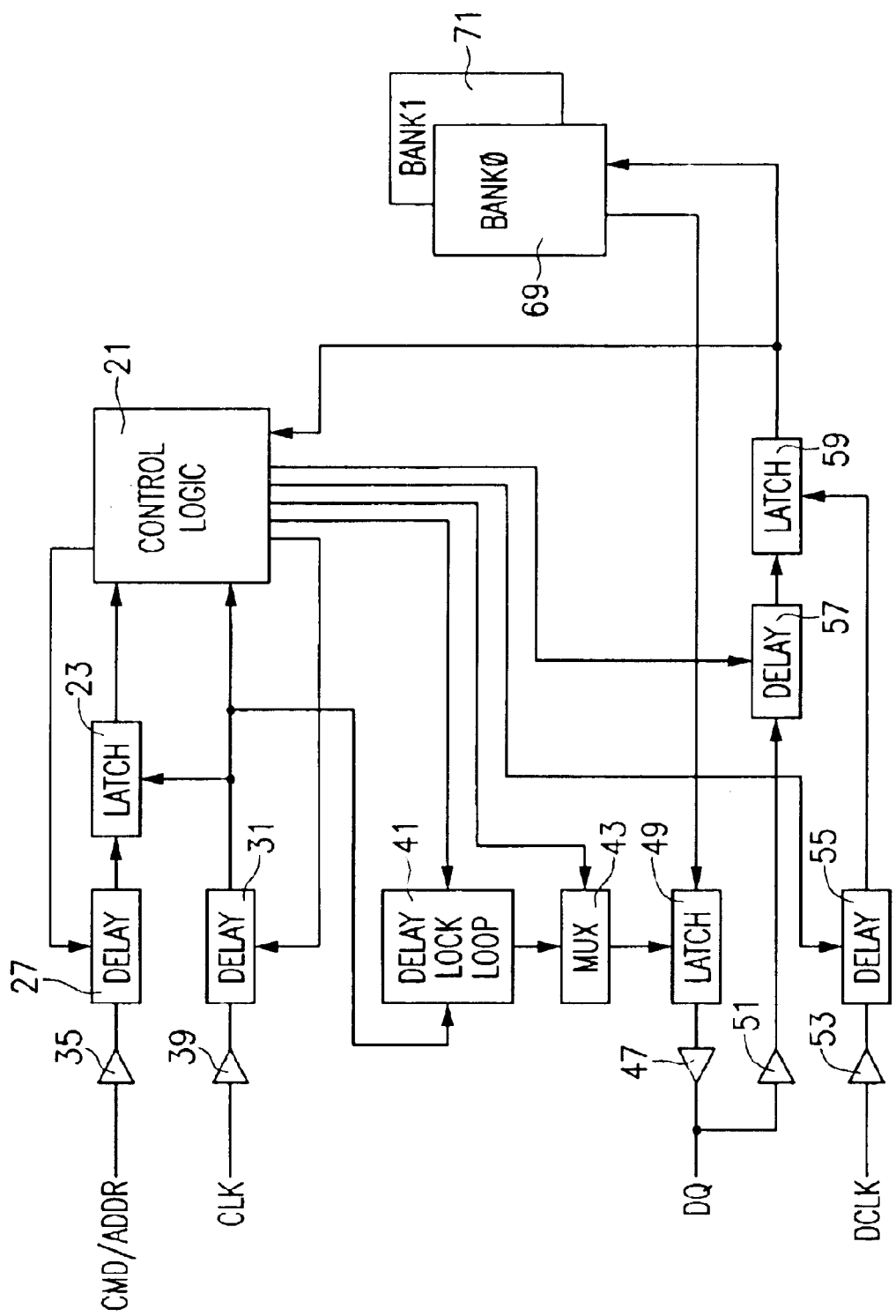
FIG. 2 illustrates a portion of the memory circuit shown in FIG. 1.

FIG. 2 illustrates a simplified relevant portion of one of the DRAM modules 11a . . . 11n, including a control logic circuit 21 of the type illustrated in FIG. 9(B). The DRAM circuitry includes latches 23, 49, 59, variable delay devices 27, 31, 55, 57, buffers 35, 39, 47, 51, 53, a delay lock loop 41, multiplexer 43, and respective memory banks Bank0 and Bank1 69, 71. It should be noted that although two memory banks are illustrated in FIG. 2, this is just illustrative, as any number of memory banks can be used.

Control logic circuit 21 receives and analyzes commands on the command/address path CMD/ADDR and controls the input/output (I/O) access operations of the memory banks 69, 71. The control logic circuit 21 also receives the clock signal CLK.

The signal on the command/address path CMD/ADDR is passed through adjustable delay circuit 27 and into latch 23 where the signal is latched by a clock signal CLK, as buffered by buffer 39 and delayed by variable delay 31.

The clock signal CLK also passes into a delay lock loop circuit 41 which provides a data output timing signal into a multiplexer 43. The multiplexer provides an output timing signal to a latch 49 which latches data output from the memory banks 69, 71. The output data latched in latch 49 is provided to a buffer amplifier 47 and from there is passed back to memory controller 13 via the data bus DQ.

Data which is to be input to memory banks 69, 71 is supplied by memory controller 13 (FIG. 1) on the DQ data bus, is passed through buffer 51 through variable delay 57, into latch 59, and into a memory bank 69, 71. The data clock or data strobe signal DCLK, as buffered in buffer 53 and delayed by variable delay 55, is used to control latch 59 to latch in incoming data on the data bus DQ.

In order to ensure proper timing of the various memory operations performed by the DRAM modules 11a . . . 11n, the FIG. 2 circuit may be calibrated using the apparatus and method described with reference to FIGS. 9(A) and 9(B) to ensure the incoming data is properly clocked in by the clock signals CCLK and DCLK. To this end, a calibration pattern is applied to the command/address input path CMD/ADDR while the data pattern is sampled in latch 23 by the delayed clock signal CLK. The control logic circuit 21 steps through all possible delay positions of delay 27 as the data sampling is performed and stores patterns representing which delay values for the variable delay 27 provide for a correct sampling and recognition of the calibration pattern. In this manner, control logic circuit 21 establishes an "eye" or "window" of acceptable delays for the variable delay 27 for the command/address data path CMD/ADDR Once a "window" of acceptable delays is found for the variable delay 27, the control logic circuit 21 determines the "best" delay value as that value which is approximately in the middle of the window.

Alternatively, the control logic could vary the variable delay circuit 31 for the clock signal CLK or both variable delays circuits 27, 31 in order to establish the window of acceptable delays.

Figure 3:
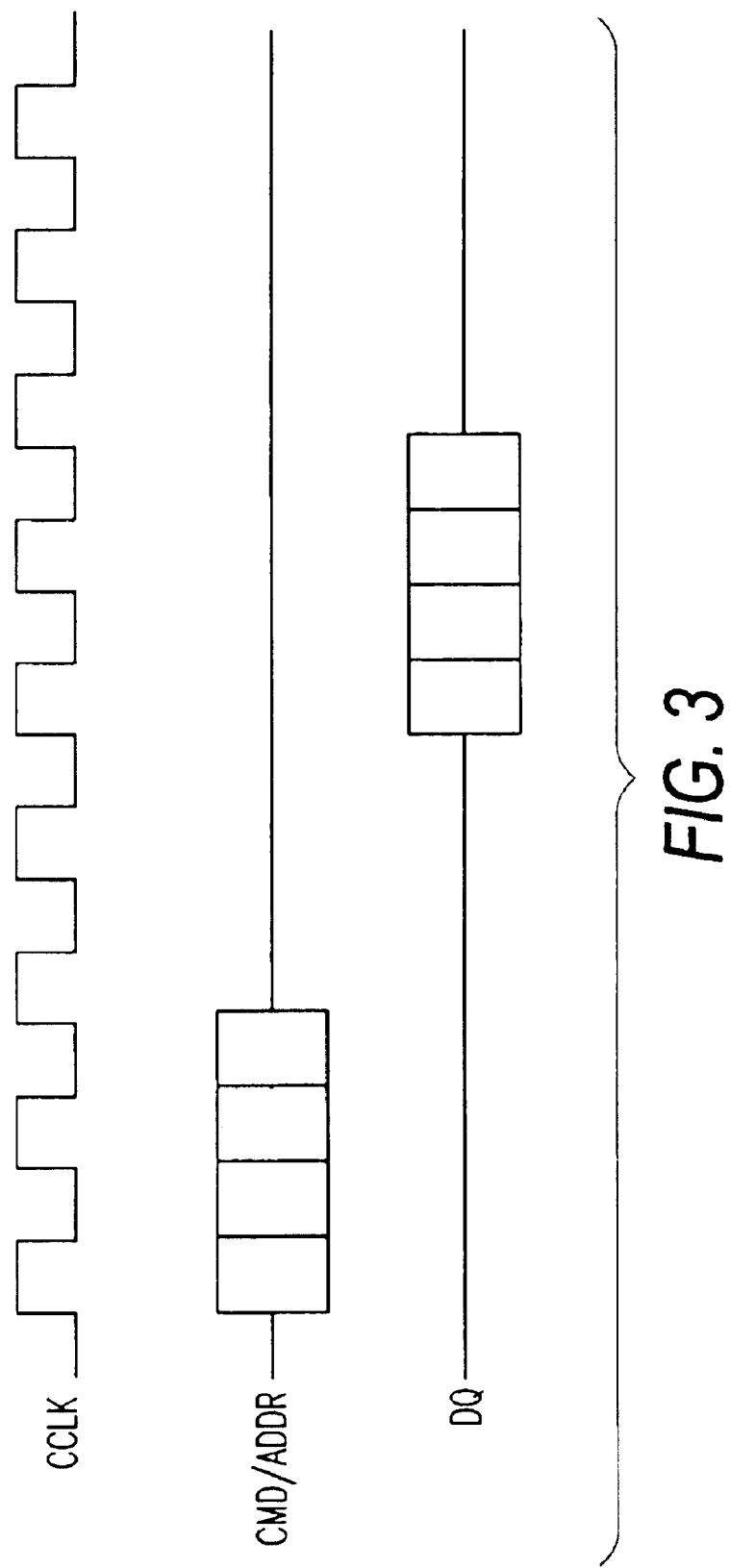
FIG. 3 illustrates a simplified timing diagram illustrating a portion of the timing signals used in the operation of the FIG. 2 circuit.

To illustrate the calibration process we will discuss calibration of the data appearing on the command/address path CMD/ADDR, it being understood that the same calibration process is also carried out on the receive path of the data bus DQ. FIG. 3 illustrates a simplified timing diagram of the clock signal CLK, the command/address signal CMD/ADDR, and a data bus signal DQ. As shown, four bits of data on a DQ path of the data bus are clocked in on four sequential positive and negative going transitions of the clock signal CLK. The data present on the command/address signal path CMD/ADDR is also clocked in by the clock signal CLK.

Returning to FIG. 2, it can be seen that the data entering on the CMD/ADDR signal path passes through variable delay circuit 27 and is latched in latch 23 by the clock signal CLK. This data is then serially applied to control logic circuit 21. During the calibration period, a calibration signal containing the calibration pattern is applied to the CMD/ADDR path by an external logic device, such as one of the logic devices 101, 103 (FIG. 9(A)), together with the free running clock signal CLK. The control logic circuit 21 knows what the calibration pattern is as it is stored in the pattern register 127, and reads the repeating calibration signal bit-by-bit from latch 23 to detect the presence of the calibration pattern. When doing so, the control logic circuit 21 first sets variable delay 27 to one known delay setting. The control logic circuit 21 then examines the bit pattern sequentially received from latch 23 to see if it matches the known calibration bit pattern. If the timing of the calibration signal data on the CMD/ADDR path is not aligned with the transitions of the CLK signal, the correct bit pattern is not recognized at the output of latch 23 and the control logic circuit 21 will adjust variable delay 27 to the next delay setting, offset by a given amount from the prior delay setting of variable delay 27. Control logic circuit 21 will again continue to examine the bit pattern emerging from latch 23 to see if it matches the calibration bit pattern. If not, it continues to increment the delay value of the variable delay 27 and repeat the sampling and examination process until the calibration bit pattern is recognized. In actuality, rather than stopping the calibration process when the correct calibration bit pattern is recognized at the output of latch 23, the control logic circuit 21 will actually step through all possible delay values of variable delay 27 and keep track of which delays produced a proper recognition of the calibration bit pattern. Then the control logic circuit 21 will select as a final delay value for variable delay 27, that value which is approximately centered between all delay values which produced a proper recognition of the calibration bit pattern.

Figure 4:
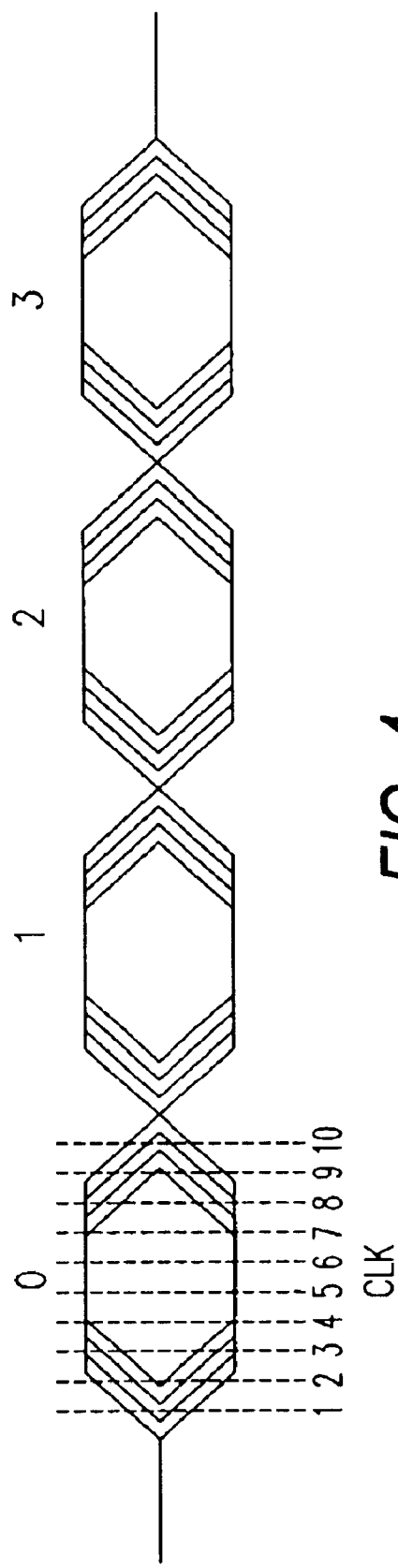
FIG. 4 illustrates a graphic example of the synchronization technique used to synchronize the memory circuit of FIG. 1.
Figure 5:
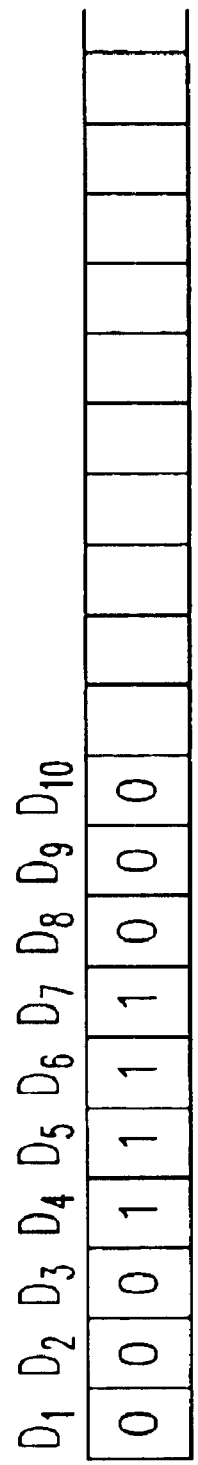
FIG. 5 illustrates a pattern of acceptable delay values for synchronization used in the invention.

FIG. 4 illustrates the command/address information envelope for consecutive bits of the calibration signal together with the clock signal CCLK which latches the command/address information in latch 23. The relative timing of the command/address information envelope and the clock CLK is illustrated as ten possibilities CLK 1 . . . 10, that is, ten possible delay values for variable delay 27. The beginning and end of the command/address information envelope is where the command/address information on the CMD/ADDR path is unstable which can lead to erroneous sampling of the command/address information. As shown, reliable capture of the command/address information occurs at the relative timing location $C_4$ through $C_7$, while unreliable capture occurs at the relative timing locations $C_1 \ldots C_3$ and $C_8 \ldots C_{10}$. These are represented within control logic circuit 21 as delay values $D_4 \ldots D_7$, where the calibration bit pattern was properly recognized. FIG. 5 illustrates how this is represented in control logic circuit 21 where delay values $D_1 \ldots D_3$ and $D_8 \ldots D_{10}$ show a "0" logic state representing that the calibration pattern was not recognized and the logic state "1" for delay values $D_4 \ldots D_7$, indicating a proper recognition of the calibration pattern. It should be understood that although only 10 relative delay states of the command/address information to the command clock signal CLK are shown for simplicity, in actual practice there may be many more possible delay stages for variable delay 27 and the logic state pattern illustrated in FIG. 5.

Once the delay state pattern shown in FIG. 5 is developed by control logic circuit 21, it selects as a final delay for variable delay 27 a delay value which is approximately in the center of those delay values, e.g., $D_4 \ldots D_7$, which produced a proper recognition of the calibration pattern. In the example illustrated, the final delay would be selected as $D_5$ or $D_6$. Once this value is set for variable delay 27, the CMD/ADDR data path has been calibrated. The same calibration procedure is also applied to the data path of the DQ bus.

Figure 8:
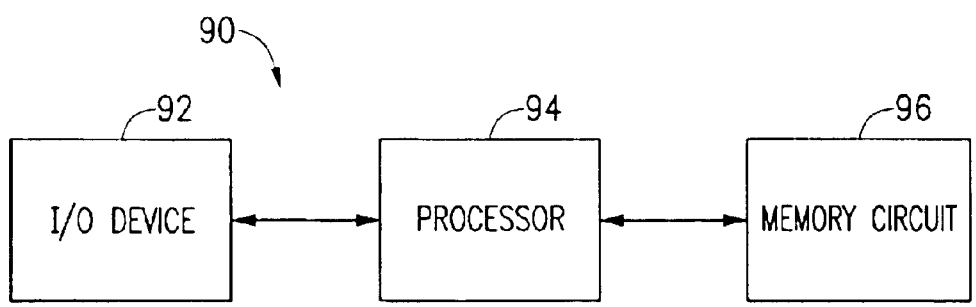
FIG. 8 illustrates a processor system using a DRAM memory which employs calibration structures and process methodologies in accordance with the invention.

A logic circuit containing the calibration structure and operating as described above may also be used in a processor system of the type shown in FIG. 8. The processor system 90 comprises a processor 94, a memory circuit 96, and an I/O (input/output) device 92. The memory circuit 96 contains the calibration structure operating as described in accordance with the present invention. In addition to, or instead of, the memory circuit 96, the processor 94 may contain the calibration structure and operate according to the calibration methodology as described in accordance with the invention. In addition, the processor 94 may itself be an integrated processor which utilizes on chip memory devices containing the calibration structure of the present invention.

In the preceding discussion, the apparatus and method of the invention has been described with regard to a memory device which clocks data (i.e., reads or writes data) twice per clock cycle: on both the rising and falling edges of the clock. However, the present invention may be used in any memory device in which calibration is performed, including devices which clock data once per clock cycle, for example on one of either the rising or falling edge of the clock.

While the invention has been described and illustrated with reference to exemplary embodiments, many variations can be made and equivalents substituted without departing from the spirit or scope of the invention. Accordingly, the invention is not to be understood as being limited by the foregoing description, but is only limited by the scope of the appended claims.

What is claimed as new and desired to be protected by Letters Patent of the United States is:

1. A method of calibrating a digital circuit, comprising:
   receiving a calibration bit pattern at a first logic device;
   storing said received calibration bit pattern at said first logic device;
   using said stored first calibration pattern during subsequent calibration operations to adjust a relative timing of clock and data signals on at least one data path of said first logic device to produce a reliable detection of said calibration bit pattern.

2. A method as in claim 1 wherein said receiving of said calibration bit pattern is performed at a first data rate slower than a normal operating data rate at which said first logic device usually receives data.

3. A method as in claim 2 wherein said reliable detection of said calibration bit pattern is performed at a second data rate approximately equal to said normal operating data rate.

4. A method as in claim 3 wherein said second data rate is about an integer number of times as fast as said first data rate.

5. A method as in claim 3 wherein said second data rate is about four times as fast as said first data rate.

6. A method as in claim 3 wherein said second data rate is about eight times as fast as said first data rate.

7. A method as in claim 2 wherein said receiving of said calibration bit pattern at said first data rate includes lowering a frequency of a clock signal used to synchronize said act of receiving.

8. A method as in claim 2 further comprising deactivating one of a delay locked loop (DLL) and phase locked loop (PLL) circuits at said first logic device at least during said act of receiving said calibration bit pattern.

9. A method as in claim 1 further comprising receiving a pattern input mode command at said first logic device prior to receiving said calibration bit pattern at said first logic device.

10. A method as in claim 9 wherein said receiving of said pattern input mode command is performed at a first data rate slower than a normal operating data rate of said first logic device.

11. A method as in claim 10 wherein said receiving of said pattern input mode command includes using data paths of said first logic device that normally operate at said first data rate.

12. A method as in claim 10 wherein said receiving of said pattern input mode command includes receiving said command N consecutive times on a command and address bus.

13. A method as in claim 12 wherein said pattern input mode command is a burst terminate command and N is an integer equal to 4.

14. A method as in claim 12 wherein said pattern input mode command is a burst terminate command and N is an integer equal to 6.

15. A method as in claim 1 wherein said act of storing includes storing every bit received at said first logic device, and said act of using said stored calibration bit pattern during subsequent calibration operations includes retrieving only every Nth bit stored during said act of storing.

16. A method as in claim 15 wherein said act of retrieving every Nth bit stored includes using a linear address counter to count only every Nth address of said received bits stored during said act of storing.

17. A method as in claim 15 wherein said act of retrieving every Nth bit stored includes using a test mode circuit to count only every Nth address of said received bits stored during said act of storing.

18. A method as in claim 1 wherein said act of storing includes storing only every Nth bit of data received at said first logic device.

19. A method as in claim 1 wherein said act of storing includes using a prefetch demultiplexer that stores only every Nth bit received.

20. A method as in claim 1 wherein said receiving of said calibration bit pattern includes receiving said calibration bit pattern from a BIOS.

21. A method as in claim 1 wherein said receiving of said calibration bit pattern is performed using a READ/WRITE data bus connected to said first logic device.

22. A method as in claim 1 wherein said receiving of said calibration bit pattern is performed using a command and address bus connected to said first logic device.

23. A method as in claim 1, wherein said data path is an address path.

24. A method as in claim 1, wherein said data path is a command signal path.

25. A method as in claim 1, wherein said data path is a data bus signal path.

26. A method as in claim 1, wherein said data path is an input data line signal path.

27. A method as in claim 1, wherein said calibration method is performed at power-up and reset of said digital circuit.

28. A method of calibrating a digital circuit, comprising:
providing a first calibration bit pattern at a location external to a first logic device;
transmitting said first calibration pattern to said first logic device;
storing said transmitted first calibration pattern at said first logic device;
producing a first calibration signal by repeating said first calibration pattern;
applying said repeating first calibration signal to at least one data path of said first logic device; and
using said stored first calibration pattern, said applied first calibration signal and a clock signal at said first logic device to adjust a relative timing of clock and data signals on at least one data path of said first logic device to produce a reliable detection of said calibration bit pattern on said at least one data path.

29. A method as in claim 28 wherein said transmitting of said first calibration pattern is performed at a first data rate slower than a normal operating data rate at which said first logic device usually receives data.

30. A method as in claim 29 wherein said reliable detection of said first calibration pattern is performed at a second data rate approximately equal to said normal operating data rate.

31. A method as in claim 30 wherein said second data rate is approximately four times as fast as said first data rate.

32. A method as in claim 30 wherein said second data rate is approximately eight times as fast as said first data rate.

33. A method as in claim 29 wherein said transmitting of said first calibration pattern at said first data rate includes lowering a frequency of a clock signal used to synchronize said act of transmitting.

34. A method as in claim 33 further comprising deactivating one of a delay locked loop (DLL) and phase locked loop (PLL) circuits at said second logic device at least during said act of transmitting of said first calibration pattern.

35. A method as in claim 28 further comprising transmitting a pattern input mode command to said first logic device prior to transmitting said first calibration pattern to said first logic device.

36. A method as in claim 35 wherein said transmitting of said pattern input mode command is performed at a first data rate slower than a normal operating data rate of said digital circuit.

37. A method as in claim 36 wherein said transmitting of said pattern input mode command includes using data paths of said first logic device that normally operate at said first data rate.

38. A method as in claim 35 wherein said transmitting of said pattern input mode command includes repeating a command N consecutive times on a command or address bus.

39. A method as in claim 38 wherein said repeated command is a burst terminate command and N is an integer equal to 4.

40. A method as in claim 38 wherein said repeated command is a burst terminate command and N is an integer equal to 6.

41. A method as in claim 28 wherein said transmitting of said first calibration pattern at said first data rate includes transmitting each bit of said first calibration pattern N consecutive times.

42. A method as in claim 28 wherein N is an integer equal to 4.

43. A method as in claim 28 wherein said act of storing includes storing only every Nth bit transmitted to said first logic device.

44. A method as in claim 28 wherein said act of storing includes storing every bit transmitted to said first logic device, and said act of producing said repeating first calibration signal includes retrieving only every Nth bit stored during said act of storing.

45. A method as in claim 28 wherein said act of storing includes using a prefetch demultiplexer that shifts only every Nth bit into storage.

46. A method as in claim 28 wherein said act of producing said repeating first calibration signal includes using a linear address counter to count only every Nth address of said transmitted bits stored during said act of storing.

47. A method as in claim 28 wherein said act of producing said repeating first calibration signal includes using a test mode circuit to count only every Nth address of said transmitted bits stored during said act of storing.

48. A method as in claim 28 further comprising deactivating one of a delay locked loop (DLL) and phase locked loop (PLL) circuits at said second logic device at least during said act of transmitting said first calibration pattern.

49. A method as in claim 28 wherein said providing of said first calibration pattern includes retrieving said first calibration pattern from a BIOS.

50. A method as in claim 28 wherein said transmitting of said first calibration pattern is performed using a READ/WRITE data bus connected to said first logic device.

51. A method as in claim 28 wherein said transmitting of said first calibration pattern is performed using a command or address bus connected to said first logic device.

52. A method as in claim 28, wherein said data path is an address path.

53. A method as in claim 28, wherein said data path is a command signal path.

54. A method as in claim 28, wherein said data path is a data bus signal path.

55. A method as in claim 28, wherein said data path is an input data line signal path.

56. A method as in claim 28, wherein said calibration method is performed at power-up and reset of said digital circuit.

57. A method as in claim 28, wherein said clock signal clocks data on at least one of a rising or failing edge of said clock signal.

58. A method as in claim 28, wherein said clock signal clocks data on both rising and falling edges of said clock signal.

59. A method of calibrating a digital circuit, comprising:
   providing a first calibration bit pattern to a first logic device;
   transmitting said first calibration pattern from said first logic device to a second logic device;
   storing said transmitted first calibration pattern at said second logic device;
   producing a first calibration signal by repeating said first calibration pattern at said second logic device;
   applying said repeating first calibration signal to at least one data path of said first logic device; and
   using said provided first calibration pattern, said applied first calibration signal and a clock signal at said first logic device to adjust a relative timing of clock and data signals on at least one data path of said first logic device to produce a reliable detection of said calibration bit pattern on said at least one data path.

60. A method as in claim 59, further comprising producing a repeating second calibration signal that includes said first calibration pattern at said first logic device, applying said second calibration signal to at least one data path of said second logic device, and using said stored first calibration pattern, said applied second calibration signal and a clock signal at said second logic device to adjust a relative timing of clock and data signals on at least one data path of said second logic device to produce a reliable detection of said calibration bit pattern on said at least one data path of said second logic device.

61. A method as in claim 60 wherein said transmitting of said first calibration pattern to said second logic device is performed at a first data rate slower than a normal operating data rate of said digital circuit, and said applying of said first calibration signal to said at least one data path of said first logic device is performed at a second data rate approximately equal to said normal operating data rate.

62. A method as in claim 61 wherein said applying of said second calibration signal to said at least one data path of said second logic device is performed at said second data rate approximately equal to said normal operating data rate.

63. A method as in claim 59 wherein said transmitting of said first calibration pattern to said second logic device is performed at a first data rate slower than a normal operating data rate of said digital circuit, and said applying of said first calibration signal to said at least one data path of said first logic device is performed at a second data rate approximately equal to said normal operating data rate.

64. A method as in claim 63 wherein said transmitting of said first calibration pattern at said first data rate includes lowering a frequency of a clock signal used to synchronize said act of transmitting.

65. A method as in claim 63 wherein said second data rate is approximately four times as fast as said first data rate.

66. A method as in claim 63 wherein said second data rate is approximately eight times as fast as said first data rate.

67. A method as in claim 63 wherein said transmitting of said first calibration pattern at said first data rate includes transmitting each bit of said first calibration pattern N consecutive times.

68. A method as in claim 67 wherein N is an integer equal to 4.

69. A method as in claim 67 further comprising deactivating one of a is delay locked loop (DLL) and phase locked loop (PLL) circuits at said second logic device at least during said act of transmitting of said first calibration pattern.

70. A method as in claim 59 further comprising transmitting a pattern input mode command to at least said second logic device prior to transmitting said first calibration pattern to said second logic device.

71. A method as in claim 70 wherein said transmitting of said pattern input mode command is performed at a first data rate slower than a normal operating data rate of said digital circuit.

72. A method as in claim 71 wherein said transmitting of said pattern input mode command includes using data paths of said second logic device that normally operate at said first data rate.

73. A method as in claim 70 wherein said transmitting of said pattern input mode command includes repeating a command N consecutive times on said command or address bus.

74. A method as in claim 73 wherein said repeated command is a burst terminate command and N is an integer equal to 4.

75. A method as in claim 73 wherein said repeated command is a burst terminate command and N is an integer equal to 6.

76. A method as in claim 59 wherein said act of storing includes storing only every Nth bit transmitted to said second logic device.

77. A method as in claim 59 wherein said act of storing includes storing every bit transmitted to said second logic device, and said act of producing said repeating first calibration signal includes retrieving only every Nth bit stored during said act of storing.

78. A method as in claim 59 wherein said act of storing includes using a prefetch demultiplexer that shifts only every Nth bit into storage.

79. A method as in claim 59 wherein said act of producing said repeating first calibration signal includes using a linear address counter to count only every Nth address of said transmitted bits stored during said act of storing.

80. A method as in claim 59 wherein said act of producing said repeating first calibration signal includes using a test mode circuit to count only every Nth address of said transmitted bits stored during said act of storing.

81. A method as in claim 59 further comprising deactivating one of a delay locked loop (DLL) and phase locked loop (PLL) circuits at said second logic device at least during said act of transmitting said first calibration pattern.

82. A method as in claim 59 wherein said transmitting of said first calibration pattern to said second logic device is performed using a serial link.

83. A method as in claim 59 wherein said applying of said first calibration signal to said at least one signal path of said first logic device is performed at a data rate slower than or approximately equal to a normal operating data rate of said digital circuit.

84. A method as in claim 59 wherein said providing of said first calibration pattern includes loading said first calibration pattern from a BIOS.

85. A method as in claim 59 wherein said providing of said first calibration pattern includes loading said first calibration pattern from a ROM.

86. A method as in claim 59 wherein said providing of said first calibration pattern includes loading said first calibration pattern using a bus.

87. A method as in claim 59 wherein said providing of said first calibration pattern includes transmitting said first calibration pattern over a network connection.

88. A method as in claim 59 wherein said transmitting of said first calibration pattern to said second logic device includes transmitting said first calibration pattern over a network connection.

89. A method as in claim 59 wherein said transmitting of said first calibration pattern to said second logic device is performed using a command or address bus.

90. A method as in claim 59 wherein said transmitting of said first calibration pattern to said second logic device is performed using a command or address bus, and said applying of said first calibration signal to said at least one signal path of said first logic device is performed using a READ/WRITE data bus.

91. A method as in claim 59 wherein said transmitting of said first calibration pattern to said second logic device is performed using a first data bus, and said applying of said first calibration signal to said at least one signal path of said first logic device is performed using a second data bus.

92. A method as in claim 59 wherein said transmitting of said first calibration pattern to said second logic device is performed using a first portion of a bus, and said applying of said first calibration signal to said at least one signal path of said first logic device is performed using a second portion of said bus different from said first portion of said bus.

93. A method as in claim 59 wherein said providing of said first calibration pattern includes using cache memory to temporarily store said first calibration pattern.

94. A method as in claim 59 wherein said storing of said transmitted first calibration pattern includes using cache memory to temporarily store said transmitted first calibration pattern.

95. A method as in claim 59 wherein said first logic device is a memory controller and said second logic device is a memory device.

96. A method as in claim 59 wherein said first logic device is a bus master and said second logic device is a bus slave.

97. A method as in claim 59 wherein said first logic device is a DRAM controller and said second logic device is a DRAM memory device.

98. A method as in claim 59 wherein said first logic device is a microprocessor and said second logic device is a control logic chip.

99. A method as in claim 59 wherein said first logic device is one of a network hub and switch and said second logic device is an adapter card.

100. A method as in claim 59 wherein said signal path is an address signal path.

101. A method as in claim 59 wherein said signal path is a command signal path.

102. A method as in claim 59 wherein said signal path is a data bus signal path.

103. A method as in claim 59 wherein said signal path is an input data line signal path.

104. A method as in claim 59 wherein said calibration method is performed at power-up and reset of said digital circuit.

105. A digital circuit for calibrating an incoming signal path of a logic device, comprising:

an incoming pattern signal path;

a pattern storage device;

at least one incoming data signal path;

at least one variable delay circuit, respectively provided in said incoming data signal path or a clock signal path;

a control logic circuit connected to receive a calibration pattern signal including a calibration bit pattern on said incoming pattern signal path and store said calibration bit pattern in said pattern storage device, said control logic circuit subsequently using said stored calibration bit pattern and a clock signal during calibration operations to adjust said variable delay circuit to a delay value which produces a reliable detection of said stored calibration bit pattern within a calibration data signal received on said at least one incoming data signal path.

106. The digital circuit of claim 105, further comprising a comparator circuit which compares bit patterns within said calibration data signal received on said at least one incoming data signal path with said stored calibration bit pattern during calibration operations, said control logic circuit using an output of said comparator circuit to determine said reliable detection of said calibration bit pattern within said calibration data signal.

107. The digital circuit of claim 105 wherein said calibration pattern signal is received on said incoming pattern signal path at a first data rate slower than a normal operating data rate of said digital circuit.

108. The digital circuit of claim 107 wherein said calibration data signal is received on said at least one incoming data signal path at a second data rate approximately equal to said normal operating rate of said digital circuit.

109. The digital circuit of claim 107 wherein said calibration data signal is received on said at least one incoming data signal path at a second data rate slower is than or approximately equal to said normal operating rate of said digital circuit.

110. The digital circuit of claim 107 wherein said normal operating data rate of said digital circuit is about an integer number of times as fast as said first data rate.

111. The digital circuit of claim 110 wherein said normal operating data a rate of said digital circuit is about four times as fast as said first data rate.

112. The digital circuit of claim 110 wherein said normal operating data rate of said digital circuit is about eight times as fast as said first data rate.

113. The digital circuit of claim 105 wherein said calibration bit pattern is received from a data bus connected to said incoming pattern signal path.

114. The digital circuit of claim 105 wherein said calibration bit pattern is received from a command or address bus connected to said incoming pattern signal path.

115. The digital circuit of claim 105 wherein said at least one incoming data signal path is an address signal path.

116. The digital circuit of claim 105 wherein said at least one incoming data signal path is a command signal path.

117. The digital circuit of claim 105 wherein said at least one incoming data signal path is a data bus signal path.

118. The digital circuit of claim 105 wherein said at least one incoming data signal path is an input line signal path.

119. The digital circuit of claim 105 wherein said calibration bit pattern is received and calibration operations are performed at power-up and reset of said logic device.

120. The digital circuit of claim 105 wherein said clock signal clocks data on at least one of a rising or falling edge of said clock signal.

121. The digital circuit of claim 105 wherein said clock signal clocks data on both rising and falling edges of said clock signal.

122. A logic device, comprising:
an incoming pattern signal path;
a pattern storage device;
at least one incoming data signal path;
at least one variable delay circuit, respectively provided in said incoming data signal path or a clock signal path;
a control logic circuit connected to receive a calibration pattern signal including a calibration bit pattern on said incoming pattern signal path and store said calibration bit pattern in said pattern storage device, said control logic circuit subsequently using said stored calibration bit pattern and a clock signal during calibration operations to adjust said variable delay circuit to a delay value which produces a reliable detection of said stored calibration bit pattern within a calibration data signal received on said incoming data signal path.

123. The logic device of claim 122, further comprising a comparator circuit which compares bit patterns within said calibration data signal received on said at least one incoming data signal path with said stored calibration bit pattern during calibration operations, said control logic circuit using an output of said comparator circuit to determine said reliable detection of said calibration bit pattern within said calibration data signal.

124. The logic device of claim 122 wherein said calibration pattern signal is received on said incoming pattern signal path at a first data rate slower than a normal operating data rate of said digital circuit.

125. The logic device of claim 124 wherein said calibration data signal is received on said at least one incoming data signal path at a second data rate approximately equal to said normal operating rate of said digital circuit.

126. The logic device of claim 124 wherein said calibration data signal is received on said at least one incoming data signal path at a second data rate slower than or approximately equal to said normal operating rate of said digital circuit.

127. The logic device of claim 124 wherein said normal operating data rate of said digital circuit is about an integer number of times as fast as said first data rate.

128. The logic device of claim 127 wherein said normal operating data rate of said digital circuit is about four times as fast as said first data rate.

129. The logic device of claim 127 wherein said normal operating data rate of said digital circuit is about eight times as fast as said first data rate.

130. The logic device of claim 122 wherein said calibration bit pattern is received from a data bus connected to said incoming pattern signal path.

131. The logic device of claim 122 wherein said calibration bit pattern is received from a command or address bus connected to said incoming pattern signal path.

132. The logic device of claim 122 wherein said at least one incoming data signal path is an address signal path.

133. The logic device of claim 122 wherein said at least one incoming data signal path is a command signal path.

134. The logic device of claim 122 wherein said at least one incoming data signal path is a data bus signal path.

135. The logic device of claim 122 wherein said at least one incoming data signal path is an input line signal path.

136. The logic device of claim 122 wherein said calibration bit pattern is received and calibration operations are performed at power-up and reset of said logic device.

137. The logic device of claim 122 wherein said clock signal clocks data on at least one of a rising or falling edge of said clock signal.

138. The logic device of claim 122 wherein said clock signal clocks data on both rising and falling edges of said clock signal.

139. A digital logic system, comprising:
a first logic device;
a second logic device connected to said first logic device; and
a calibration circuit on at least one of said first and second logic devices, said calibration circuit comprising:
an incoming pattern signal path;
a pattern storage device;
at least one incoming data signal path;
at least one variable delay circuit, respectively provided in said incoming data signal path or a clock signal path;
a control logic circuit connected to receive a calibration pattern signal including a calibration bit pattern on said incoming pattern signal path and store said calibration bit pattern in said pattern storage device, said control logic circuit subsequently using said stored calibration bit pattern and a clock signal during calibration operations to adjust said variable delay circuit to a delay value which produces a reliable detection of said stored calibration bit pattern within a calibration data signal received on said at least one incoming data signal path.

140. The logic system of claim 139 wherein said calibration circuit further comprises a repeater circuit that produces a repeating calibration signal using said stored calibration bit pattern.

141. The logic system of claim 139, further comprising a comparator circuit which compares bit patterns with said calibration data signal received on said at least one incoming data signal path with said stored calibration pattern during calibration operations, said control logic circuit using an output of said comparator circuit to determine said reliable detection of said stored calibration bit pattern.

142. The logic system of claim 139, further comprising a calibration circuit on at least said first logic device and said second logic device.

143. The logic system of claim 139 wherein said calibration pattern signal is received on said incoming pattern signal path at a first data rate slower than a normal operating data rate of said logic circuit.

144. The logic system of claim 143 wherein said calibration data signal is received on said at least one incoming data signal path at a second data rate approximately equal to said normal operating rate of said logic circuit.

145. The logic system of claim 143 wherein said calibration signal is received on said at least one incoming data signal path at a second data rate slower than or approximately equal to said normal operating rate of said logic circuit.

146. The logic system of claim 145 wherein said normal operating data rate of said logic circuit is about four times as fast as said first data rate.

147. The logic system of claim 145 wherein said normal operating data rate of said logic circuit is about eight times as fast as said first data rate.

148. The logic system of claim 143 wherein said first data rate slower than said normal operating rate is achieved by lowering a frequency of a clock signal used to clock receipt of said calibration pattern.

149. The logic system of claim 139 wherein said calibration pattern is received from a command or address bus connected to said incoming pattern signal path.

150. The logic system of claim 139 wherein said at least one incoming data signal path is an address signal path.

151. The logic system of claim 139 wherein said at least one incoming data signal path is a command signal path.

152. The logic system of claim 139 wherein said at least one incoming data signal path is a data bus signal path.

153. The logic system of claim 139 wherein said at least one incoming data signal path is an input line signal path.

154. The logic system of claim 139 wherein said calibration bit pattern is received and calibration operations are performed at power-up and reset of said logic circuit.

155. The logic system of claim 139 wherein said clock signal clocks data on at least one of a rising or failing edge of said clock signal.

156. The logic system of claim 139 wherein said clock signal clocks data on both rising and failing edges of said clock signal.

157. The logic system of claim 139 wherein said pattern storage device stores only every Nth bit received on said incoming pattern signal path.

158. The logic system of claim 139 wherein said pattern storage device stores every bit received on said incoming pattern signal path, wherein only every Nth bit stored in said pattern storage device is used by said control logic circuit during calibration operations.

159. The logic system of claim 139 further comprising a prefetch demultiplexer that shifts only every Nth bit incoming to said pattern storage device.

160. The logic system of claim 139 wherein said calibration circuit further comprises a linear address counter that counts only every Nth address, wherein said control logic circuit uses said linear address counter to retrieve only every Nth bit stored in said pattern storage device during calibration operations.

161. The logic system of claim 139 wherein said calibration circuit further comprises a test mode circuit that counts only every Nth address, wherein said control logic circuit uses said test mode circuit to retrieve only every Nth bit stored in said pattern storage device during calibration operations.

162. The logic system of claim 139 wherein said calibration pattern is received from a data bus connected to said incoming pattern signal path.

163. The logic system of claim 139 further comprising a delay locked loop (DLL) circuit that is deactivated at least during receipt of said calibration bit pattern on said incoming pattern signal path.

164. The logic system of claim 139 further comprising a phase locked loop (PLL) circuit that is deactivated at least during receipt of said calibration bit pattern on said incoming pattern signal path.

165. The logic system of claim 139 further comprising a BIOS from which said calibration bit pattern is received on said incoming pattern signal path.

166. The logic system of claim 139 further comprising a ROM from which said calibration bit pattern is received on said incoming pattern signal path.

167. The logic system of claim 139 further comprising a network connection from which said calibration bit pattern is received on said incoming pattern signal path.

168. The logic system of claim 139 further comprising a command or address bus from which said calibration bit pattern is received on said incoming pattern signal path.

169. The logic system of claim 139 further comprising a data bus from which said calibration bit pattern is received on said incoming pattern signal path, wherein said calibration data signal is received on said incoming data signal path from said data bus.

170. A processor system, comprising:
a processor; and
an integrated memory circuit connected to said processor, at least one of said integrated memory circuit and processor including at least one calibration circuit comprising:
a incoming pattern signal path;
a pattern storage device;
at least one incoming data signal path;
at least one variable delay circuit, respectively provided in said incoming data signal path or a clock signal path;
a control logic circuit connected to receive a calibration pattern on said incoming pattern signal path and store said calibration pattern in said pattern storage device, said control logic circuit subsequently using said stored calibration pattern and a clock signal during calibration operations to adjust said variable delay circuit to a delay value which produces a reliable detection of said calibration pattern within a calibration signal received on said at least one incoming data signal path.

171. The processor system of claim 170 wherein at least said processor includes said calibration circuit.

172. The processor system of claim 170 wherein at least said integrated memory circuit includes said calibration circuit.

173. The processor system of claim 170 wherein said calibration circuit further comprises a repeater circuit that produces a repeating calibration signal that includes said calibration pattern.

174. The processor system of claim 173 wherein said calibration circuit is on each of a first and second logic devices and wherein a first calibration pattern signal including said calibration bit pattern is produced at said repeater circuit of said second logic device and applied to at least one data path of said first logic device, said control logic circuit of said first logic device using said stored calibration pattern, said applied first calibration signal and said clock signal to adjust a relative timing of clock and data signals on at least one data path of said first logic device to produce a reliable detection of said calibration bit pattern on said at least one data path of said first logic device.

175. The processor system of claim 174 wherein a second calibration data signal including said calibration bit pattern is produced at said repeater circuit of said first logic device and applied to at least one data path of said second logic device, said control logic circuit of said second logic device using said stored calibration bit pattern, said applied second calibration signal and said clock signal at said second logic device to adjust a delay element in said at least one data path of said second logic device to a delay value which produces a reliable detection of said stored calibration pattern on said at least one data path of said second logic device.

176. The processor system of claim 170, further comprising a comparator circuit which compares bit patterns within said calibration data signal received on said at least one incoming data signal path with said stored calibration pattern during calibration operations, said control logic circuit using an output of said comparator circuit to determine said reliable detection of said stored calibration bit pattern.

177. The processor system of claim 170 wherein said calibration bit pattern is received on said incoming pattern signal path at a first data rate slower than a normal operating data rate of said logic circuit.

178. The processor system of claim 177 wherein said first data rate slower than said normal operating rate is achieved by lowering a frequency of a clock signal used to clock receipt of said calibration pattern.

179. The processor system of claim 170 wherein said calibration data signal is received on said at least one incoming data path at a second data rate slower than or approximately equal to said normal operating rate of said logic circuit.

180. The processor system of claim 179 wherein said normal operating data rate of said logic circuit is about four times as fast as said first data rate.

181. The processor system of claim 179 wherein said normal operating data rate of said logic circuit is about eight times as fast as said first data rate.

182. The processor system of claim 170 wherein said pattern storage device stores only every Nth bit received on said incoming pattern signal path.

183. The processor system of claim 170 wherein said pattern storage device stores every bit received on said incoming pattern signal path, wherein only every Nth bit stored in said pattern storage device is used by said control logic circuit during calibration operations.

184. The processor system of claim 170 wherein said calibration circuit further comprises a linear address counter that counts only every Nth address, wherein said control logic circuit uses said linear address counter to retrieve only every Nth bit stored in said pattern storage device during calibration operations.

185. The processor system of claim 170 wherein said calibration circuit further comprises a test mode circuit that counts only every Nth address, wherein said control logic circuit uses said test mode circuit to retrieve only every Nth bit stored in said pattern storage device during calibration operations.

186. The processor system of claim 170 wherein said calibration data signal is received on said at least one incoming data path at a second data rate approximately equal to said normal operating rate of said logic circuit.

* * * * *